(12) United States Patent
Lee et al.

(10) Patent No.: US 11,437,345 B2
(45) Date of Patent: Sep. 6, 2022

(54) DISPLAY DEVICE AND METHOD OF MANUFACTURING THE SAME

(71) Applicant: Samsung Display Co., Ltd., Yongin-si (KR)

(72) Inventors: Sung Jin Lee, Yongin-si (KR); Jin Yeong Kim, Yongin-si (KR); Jin Taek Kim, Yongin-si (KR); Soo Hyun Moon, Yongin-si (KR); Tae Hoon Yang, Yongin-si (KR); Seung Min Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/996,714

(22) Filed: Aug. 18, 2020

(65) Prior Publication Data
US 2021/0193614 A1   Jun. 24, 2021

(30) Foreign Application Priority Data

Dec. 23, 2019   (KR) .......................... 10-2019-0173286

(51) Int. Cl.
*H01L 27/32*   (2006.01)
*H01L 23/00*   (2006.01)
(Continued)

(52) U.S. Cl.
CPC .............. *H01L 24/97* (2013.01); *H01L 24/24* (2013.01); *H01L 24/82* (2013.01); *H01L 25/167* (2013.01);
(Continued)

(58) Field of Classification Search
CPC ......... H01L 24/97; H01L 24/24; H01L 24/82; H01L 25/167; H01L 27/1259;
(Continued)

(56) References Cited

U.S. PATENT DOCUMENTS 8,872,214 B2   10/2014   Negishi et al.
9,112,112 B2    8/2015   Do et al.
(Continued)

FOREIGN PATENT DOCUMENTS

KR   10-1244926 B1   3/2013
KR   10-1490758 B1   2/2015
(Continued)

*Primary Examiner* — Didarul A Mazumder
(74) *Attorney, Agent, or Firm* — Lewis Roca Rothgerber Christie LLP

(57) ABSTRACT

Provided is a display device including a substrate including a display area including a plurality of pixel areas, and a non-display area outside the display area, a pixel circuit layer including a plurality of circuit elements in the display area, a display element layer including a plurality of light-emitting elements in the display area on the pixel circuit layer, and first and second alignment lines on the substrate, and each including a main line at the same layer as at least one electrode on the display element layer, and a sub line electrically connected to the main line and at the same layer as at least one electrode on the pixel circuit layer, wherein the first alignment line and the second alignment line do not include the main line in the non-display area, and include the sub line to be spaced apart from one edge of the substrate.

10 Claims, 14 Drawing Sheets

(51) Int. Cl.
*H01L 25/16* (2006.01)
*H01L 27/12* (2006.01)

(52) U.S. Cl.
CPC ............... *H01L 27/1259* (2013.01); *H01L 2224/24147* (2013.01); *H01L 2224/95101* (2013.01); *H01L 2224/95133* (2013.01)

(58) Field of Classification Search
CPC . H01L 2224/24147; H01L 2224/95101; H01L 2224/95133
USPC .............................................. 257/91; 438/22
See application file for complete search history.

(56) References Cited

U.S. PATENT DOCUMENTS

| | | | |
|---|---|---|---|
| 9,773,761 | B2 | 9/2017 | Do |
| 10,249,603 | B2 | 4/2019 | Cho et al. |
| 10,461,123 | B2 * | 10/2019 | Kim .................... H01L 27/1255 |
| 2011/0089850 | A1 | 4/2011 | Shibata et al. |
| 2018/0019369 | A1 | 1/2018 | Cho et al. |
| 2019/0244985 | A1 * | 8/2019 | Kim ...................... H01L 33/387 |

FOREIGN PATENT DOCUMENTS

| | | |
|---|---|---|
| KR | 10-2018-0007376 A | 1/2018 |
| KR | 10-2018-0072909 A | 7/2018 |
| KR | 10-2019-0006430 A | 1/2019 |
| KR | 10-1987196 B1 | 6/2019 |

* cited by examiner

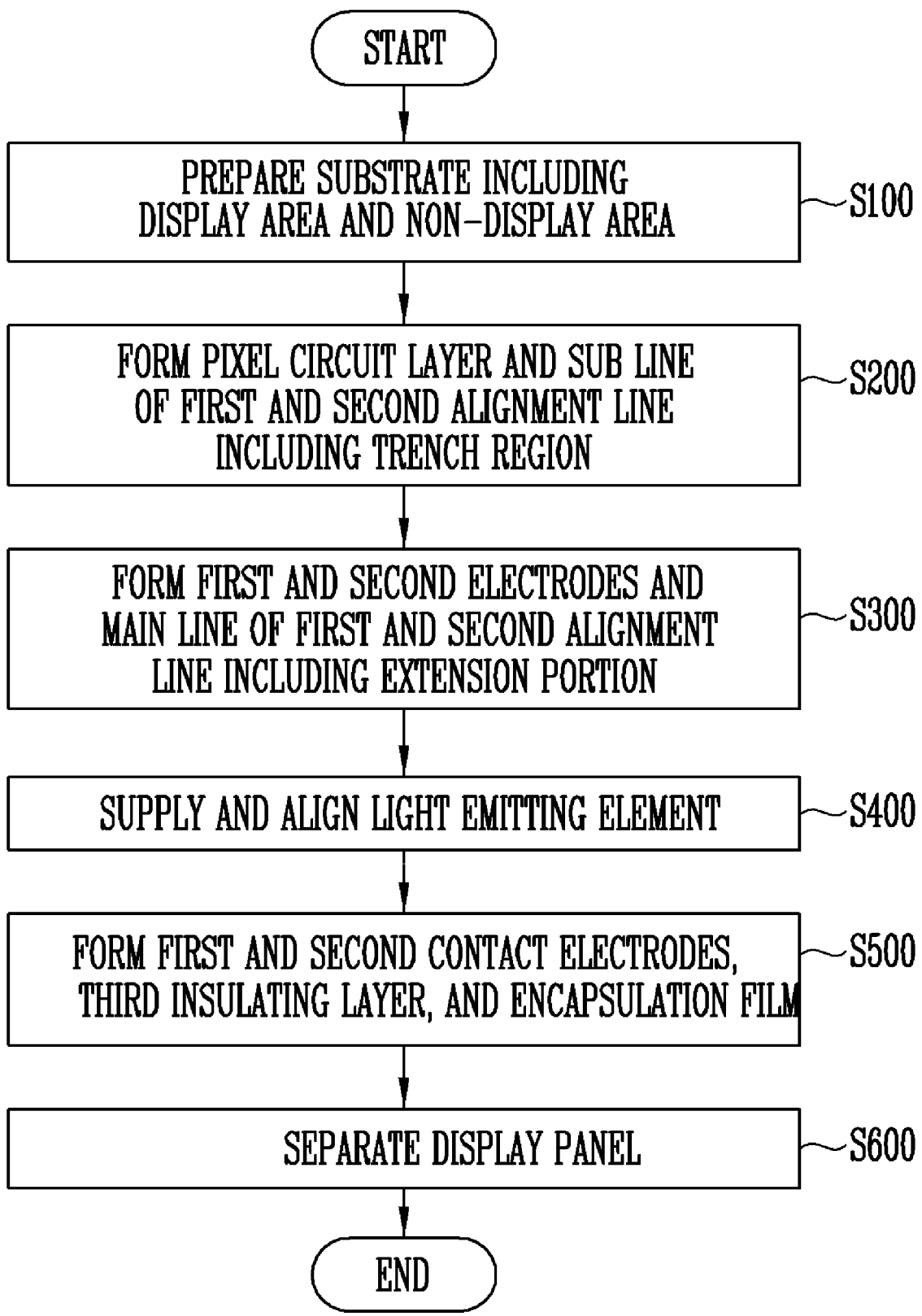

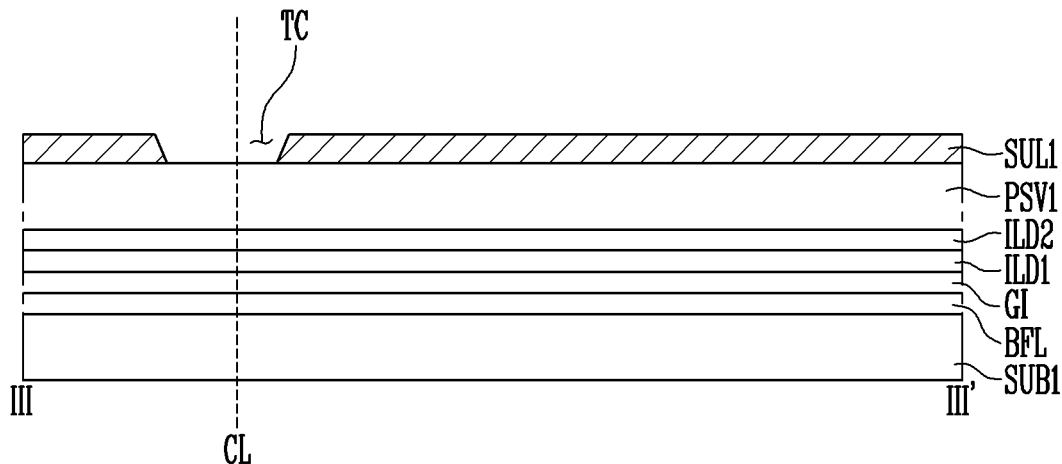
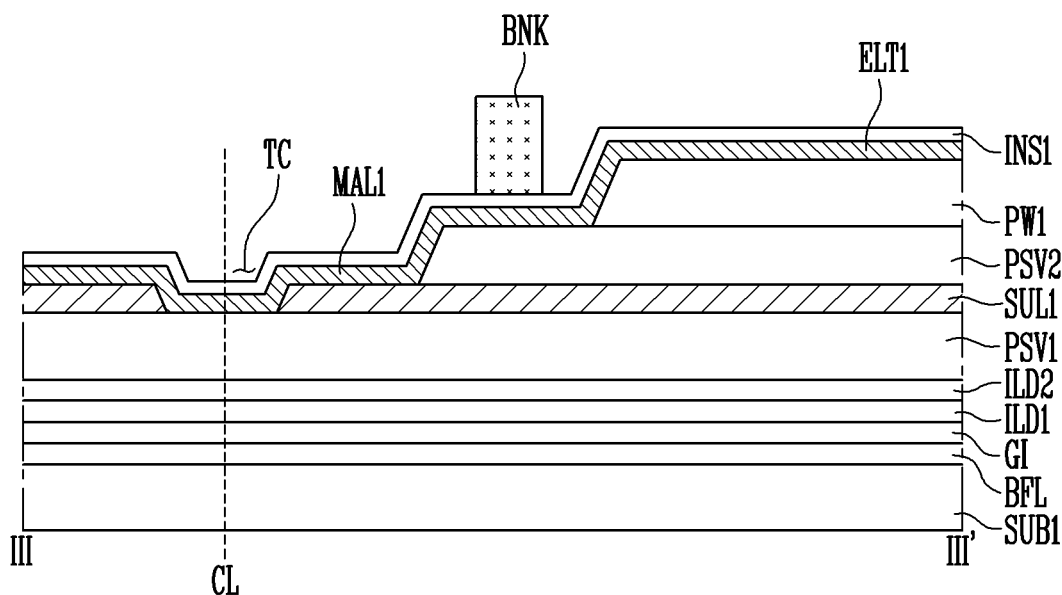

DISPLAY DEVICE AND METHOD OF MANUFACTURING THE SAME

CROSS-REFERENCE TO RELATED APPLICATION

This application claims priority to, and the benefit of, Korean Patent Application No. 10-2019-0173286 filed on Dec. 23, 2019 in the Korean Patent Office (KIPO), the entire content of which is incorporated herein by reference.

BACKGROUND

1. Field

Embodiments of the present disclosure relate to a display device and a method of manufacturing the same.

2. Description of the Related Art

In recent years, a technology of manufacturing a micro light-emitting element using a material of an inorganic crystal structure having high reliability, and manufacturing a light-emitting element using the light-emitting element is developed. For example, a technology of configuring a light source of the light-emitting element using the micro light-emitting elements having a size as small as nano scale to micro scale is developed. Such a light-emitting element may be used in various electronic devices, such as a display device or a lighting device.

The light-emitting elements may be prepared in a form in which they are dispersed in a predetermined solution, and supplied to an emission area of a pixel through an inkjet printing method, a slit coating method, or the like. At this time, when a predetermined voltage is supplied to first and second alignment lines of the pixel, an electric field is formed between the first and second alignment lines, and the light-emitting elements are self-aligned between the first and second alignment lines.

SUMMARY

Each of the first and second alignment lines may have a multilayer structure including a main line, which is located in the same layer as at least one electrode located on a display element layer including a plurality of light-emitting elements, and a sub line, which is located in the same layer as at least one electrode located on a pixel circuit layer.

In this case, in a process of cutting a cell from a mother substrate, a cross section of the sub line may be exposed along a cutting line. The sub line may be a static electricity inflow path of the cell.

An aspect of some embodiments of the present disclosure provides a display device capable of reducing or preventing a static electricity inflow by an alignment line. Another aspect of some embodiments of the present disclosure provides a method of manufacturing a display device capable of reducing or preventing a static electricity inflow by an alignment line.

A display device according to some embodiments of the disclosure includes substrate including a display area including a plurality of pixel areas, and a non-display area located outside the display area, a pixel circuit layer including a plurality of circuit elements in the display area, a display element layer including a plurality of light-emitting elements in the display area on the pixel circuit layer, and a first alignment line and a second alignment line on the substrate, and each including a main line at the same layer as at least one electrode on the display element layer, and a sub line electrically connected to the main line and at the same layer as at least one electrode on the pixel circuit layer, wherein the first alignment line and the second alignment line do not include the main line in the non-display area, and include the sub line to be spaced apart from one edge of the substrate.

The display element layer may include a first electrode and a second electrode in each pixel area on the pixel circuit layer, a first insulating layer on one region of the first electrode and the second electrode, and the light-emitting elements between the first and second electrodes of each pixel area.

The first and second electrodes may be spaced apart from each other at the same layer in each pixel area, wherein a first end portion of the light-emitting elements is electrically connected to a first electrode of a corresponding pixel, and wherein a second end portion of the light-emitting elements is electrically connected to a second electrode of the corresponding pixel.

The display device may further include a second insulating layer partially only on one region of the light-emitting elements without covering the first end portion and the second end portion of the light-emitting elements.

The display device may further include a first contact electrode connecting the first end portion and the first electrode to each other, and a second contact electrode connecting the second end portion and the second electrode to each other, wherein a third insulating layer is interposed between the first contact electrode and the second contact electrode.

An upper surface and one end portion of the sub line may be covered by the third insulating layer.

The display device may further include an encapsulation film on the third insulating layer.

The main line of each of the first and second alignment lines may be at the same layer as at least one of the first and second electrodes.

Each of the light-emitting elements may include a first conductive semiconductor layer doped with a first conductive dopant, a second conductive semiconductor layer doped with a second conductive dopant, and an active layer provided between the first conductive semiconductor layer and the second conductive semiconductor layer.

Each of the light-emitting elements may include a rod-shaped light-emitting diode having a micro scale or nano scale size.

A method of manufacturing a display device according to some embodiments of disclosure includes preparing a mother substrate including a plurality of panels each including a display area and a non-display area, forming a sub line of each of a first alignment line and a second alignment line in forming a pixel circuit layer on each of the panels, and, forming a main line of each of the first alignment line and the second alignment line in forming a first electrode and a second electrode on each pixel area of a display area of each of the panels, supplying a plurality of light-emitting elements on each pixel area, and applying power to the first alignment line and the second alignment line to align the light-emitting elements, forming a first contact electrode and a second contact electrode respectively connecting a first end portion and a second end portion of each of the light-emitting elements to the first electrode and the second electrode, and an insulating layer interposed between the first contact electrode and the second contact electrode, and separating the mother substrate into each of the panels along a cutting line, wherein forming the sub line includes forming a trench region in the sub line in a region where the sub line and the cutting line overlap in a thickness direction.

One end portion of the sub line may be exposed by the trench region, and an upper surface and one end portion of the sub line are covered by the insulating layer.

Forming the sub line may include forming at least one sub line at the same layer as at least one electrode in forming the at least one electrode on the pixel circuit layer.

Forming the main line may include forming a main line of each of the first and second alignment lines on the sub line of each of the first and second alignment lines so as to be electrically connected to each sub line.

Forming the main line may include forming an extension portion extending in a width direction in the main line in a region overlapping the trench region in the thickness direction.

Forming the insulating layer may further include forming an encapsulation film on the insulating layer.

Aligning the light-emitting elements may include removing the main line on the non-display area after the alignment of the light-emitting elements is completed.

The main line and the sub line may be electrically connected to each other through at least one contact hole.

Each of the light-emitting elements may include a first conductive semiconductor layer doped with a first conductive dopant, a second conductive semiconductor layer doped with a second conductive dopant, and an active layer provided between the first conductive semiconductor layer and the second conductive semiconductor layer.

Each of the light-emitting elements may include a rod-shaped light-emitting diode having a micro scale or nano scale size.

The display device and the method of manufacturing the display device according to some embodiments of the disclosure may reduce or prevent static electricity flowing into the cell due to the alignment line during a panel manufacturing process by forming the alignment line using only the main line in a region near the cutting line.

BRIEF DESCRIPTION OF THE DRAWINGS

The above and other aspects of the disclosure will become more apparent by describing in further detail embodiments thereof with reference to the accompanying drawings, in which:

FIG. 9 is a flowchart illustrating a method of manufacturing a display device according to some embodiments of the present disclosure;

FIGS. 12 to 16 are cross-sectional views taken along the line III-III' of FIG. 11 and are views for describing the method of manufacturing the display device of FIG. 9.

DETAILED DESCRIPTION

Figure 1A:
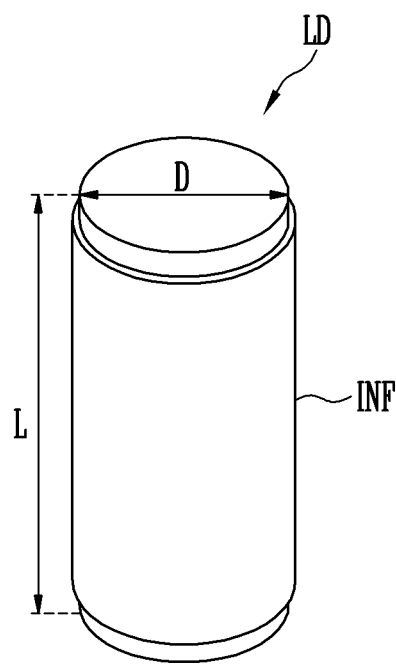
FIGS. 1A and 1B are a perspective view and a cross-sectional view illustrating a light-emitting element according to some embodiments of the present disclosure.

Features of the inventive concept and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects and features of the present inventive concept to those skilled in the art. Accordingly, processes, elements, and techniques that are not necessary to those having ordinary skill in the art for a complete understanding of the aspects and features of the present inventive concept may not be described.

Unless otherwise noted, like reference numerals denote like elements throughout the attached drawings and the written description, and thus, descriptions thereof will not be repeated. Further, parts not related to the description of the embodiments might not be shown to make the description clear. In the drawings, the relative sizes of elements, layers, and regions may be exaggerated for clarity.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When a certain embodiment may be implemented differently, a specific process order may be performed differently from the described order. For example, two consecutively described processes may be performed substantially at the same time or performed in an order opposite to the described order.

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1B:
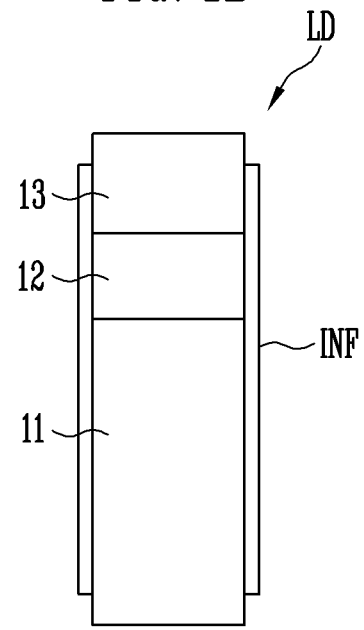

FIGS. 1A and 1B are a perspective view and a cross-sectional view illustrating a light-emitting element according to some embodiments of the disclosure. In FIGS. 1A and. 1B, a rod-shaped light-emitting element LD having a circular columnar shape is shown, but a type and/or shape of the light-emitting element LD is not limited thereto.

Referring to FIGS. 1A and 1B, the light-emitting element LD may comprise a first conductive semiconductor layer 11, a second conductive semiconductor layer 13, and an active layer 12 interposed between the first and second conductive semiconductor layers 11 and 13. For example, the light-emitting element LD may be configured of a stack in which the first conductive semiconductor layer 11, the active layer 12, and the second conductive semiconductor layer 13 are sequentially stacked in one direction.

The light-emitting element LD may be provided in a bar shape extending in one direction. The light-emitting element LD may have one end side portion and the other side end portion along one direction. One of the first and second conductive semiconductor layers 11 and 13 may be located at the one side end portion of the light-emitting element LD, and the other of the semiconductor layers 11 and 13 may be located at the other side end portion of the light-emitting element LD.

The light-emitting element LD may be a rod-shaped light-emitting diode manufactured in a rod shape. Here, the rod shape encompasses a rod-like shape or a bar-like shape that is longer in a longitudinal direction than in a width direction (that is, having an aspect ratio that is greater than 1), such as a circular column or a polygonal column. A shape of a cross section thereof is not particularly limited. For example, a length L of the light-emitting element LD may be greater than a diameter D (or a width of the cross section) thereof.

The light-emitting element LD may have the diameter D and/or the length L that is as small as a nano scale to a micro scale, for example, a range of a nano scale or a micro scale. However, a size of the light-emitting element LD is not limited thereto. For example, the size of the light-emitting element LD may be variously changed according to a design condition of various devices using a light-emitting device using the light-emitting element LD as a light source, for example, a display device.

The first conductive semiconductor layer 11 may comprise at least one n-type semiconductor layer. For example, the first conductive semiconductor layer 11 may comprise one semiconductor material among InAlGaN, GaN, AlGaN, InGaN, AlN, and InN, and may comprise an n-type semiconductor layer doped with a first conductive dopant such as Si, Ge, or Sn. However, the material for configuring the first conductive semiconductor layer 11 is not limited thereto, and various materials in addition to the above-described materials may configure the first conductive semiconductor layer 11.

The active layer 12 may be located on the first conductive semiconductor layer 11, and may be formed in a single or multiple quantum well structure. In other embodiments, a clad layer that is doped with a conductive dopant may be formed on and/or under the active layer 12. For example, the clad layer may be formed of an AlGaN layer or an InAlGaN layer. A material such as AlGaN or AlInGaN may be used to form the active layer 12, and various materials in addition to the above-described materials may configure the active layer 12.

When a voltage that is equal to or greater than a threshold voltage is applied to both ends of the light-emitting element LD, the light-emitting element LD may emit light while an electron-hole pair is coupled in the active layer 12. By controlling emission of the light-emitting element LD by using such a principle, the light-emitting element LD may be used as a light source of various light-emitting devices including a pixel of the display device.

The second conductive semiconductor layer 13 may be located on the active layer 12, and may comprise a semiconductor layer of a type that is different from that of the first conductive semiconductor layer 11. For example, the second conductive semiconductor layer 13 may comprise at least one p-type semiconductor layer. For example, the second conductive semiconductor layer 13 may comprise at least one semiconductor material among InAlGaN, GaN, AlGaN, InGaN, AlN, and InN, and may comprise a p-type semiconductor layer that is doped with a second conductive dopant such as Mg. However, the material for configuring the second conductive semiconductor layer 13 is not limited thereto, and various materials in addition to the above-described materials may be used to configure the second conductive semiconductor layer 13.

The light-emitting element LD may further comprise an insulating film INF provided on a surface. The insulating film INF may be formed on the surface of the light-emitting element LD so as to surround at least an outer circumferential surface of the active layer 12, and may further surround one region of the first and second conductive semiconductor layers 11 and 13. However, the insulating film INF may expose both end portions of the light-emitting element LD, which may have different polarities. For example, the insulating film INF may expose the both end portions of the light-emitting element LD without covering one respective end of each of the first and second conductive semiconductor layers 11 and 13 positioned at both ends of the light-emitting element LD in the longitudinal direction, for example, two planes of a cylinder (that is, an upper surface and a lower surface).

The insulating film INF may comprise at least one insulating material among silicon dioxide ($SiO_2$), silicon nitride ($Si_3N_4$), aluminum oxide ($Al_2O_3$), and titanium dioxide ($TiO_2$), but is not limited thereto. That is, a configuration material of the insulating film INF is not particularly limited, and the insulating film INF may be configured of various insulating materials.

In some embodiments, the light-emitting element LD may further comprise additional components in addition to the first conductive semiconductor layer 11, the active layer 12, the second conductive semiconductor layer 13, and/or the insulating film INF. For example, the light-emitting element LD may further comprise at least one phosphor layer, an active layer, a semiconductor layer, and/or an electrode layer located on one end side of the first conductive semiconductor layer 11, the active layer 12, and/or the second conductive semiconductor layer 13.

Figure 2A:
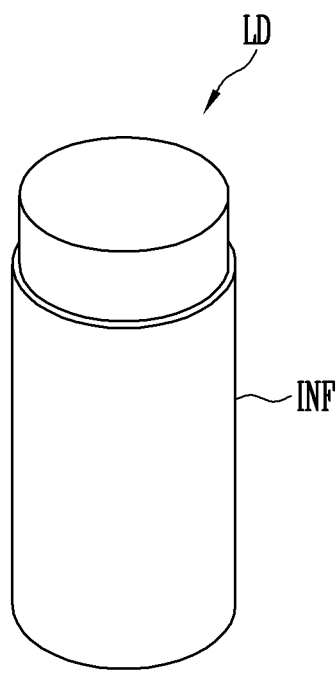
FIGS. 2A and 2B are a perspective view and a cross-sectional view illustrating the light-emitting element according to some embodiments of the present disclosure.
Figure 2B:
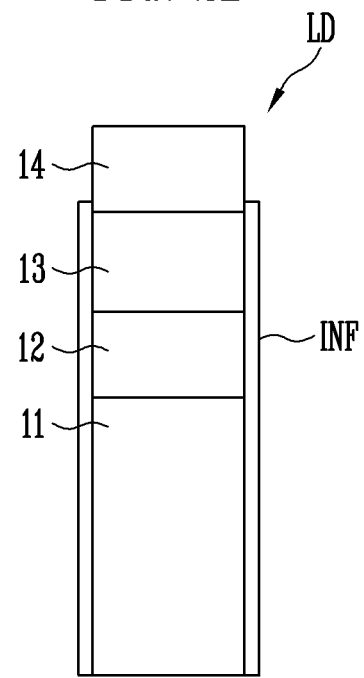
Figure 3A:
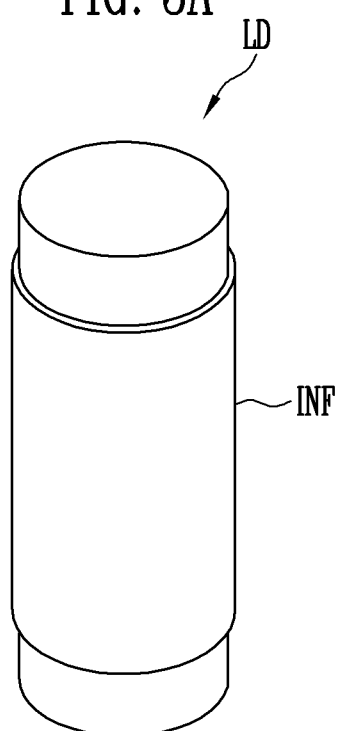
FIGS. 3A and 3B are a perspective view and a cross-sectional view illustrating the light-emitting element according to some embodiments of the present disclosure.
Figure 3B:
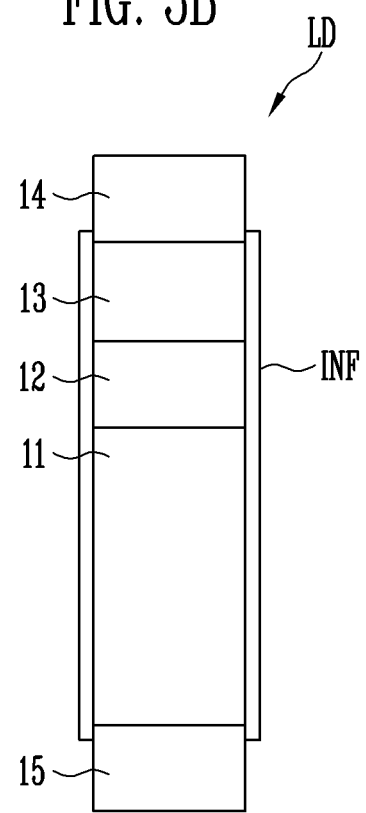

FIGS. 2A and 2B are a perspective view and a cross-sectional view illustrating the light-emitting element according to other embodiments of the disclosure. FIGS. 3A and 3B are a perspective view and a cross-sectional view illustrating the light-emitting element according to still other embodiments of the disclosure.

Referring to FIGS. 2A and 2B, the light-emitting element LD may further comprise at least one electrode layer 14 located on one end side of the second conductive semiconductor layer 13. Referring to FIGS. 3A and 3B, the light-emitting element LD may further comprise at least one other electrode layer 15 located on one end side of the first conductive semiconductor layer 11.

Each of the electrode layers 14 and 15 may be an ohmic contact electrode, but is not limited thereto. In addition, each of the electrode layers 14 and 15 may comprise a metal or a conductive metal oxide. For example, each of the electrode layers 14 and 15 may be formed of chromium (Cr), titanium (Ti), aluminum (Al), gold (Au), nickel (Ni), an oxide or an alloy thereof, a transparent electrode material such as indium tin oxide (ITO), indium zinc oxide (IZO), zinc oxide (ZnO), or an indium tin zinc oxide (ITZO) alone, or in combination thereof. The electrode layers 14 and 15 may be substantially transparent or translucent. Therefore, light generated in the light-emitting element LD may pass through the electrode layers 14 and 15, and may be emitted to the outside of the light-emitting element LD.

According to some embodiments, the insulating film INF may or may not at least partially surround outer circumferential surfaces of the electrode layers 14 and 15. That is, the insulating film INF may be selectively formed on surfaces of the electrode layers 14 and 15. In addition, the insulating film INF may be formed to expose both of the ends of the light-emitting elements LD having different polarities. For example, the insulating film INF may expose at least one region of the electrode layers 14 and 15. However, the disclosure is not limited thereto, and the insulating film INF may be omitted.

Because the insulating film INF is provided on a surface of the light-emitting element LD, for example, on a surface of the active layer 12, the active layer 12 may be reduced or prevented from being short-circuited with at least one electrode (for example, may be prevented from being short-circuited with at least one contact electrode among the contact electrodes connected to respective ends of the light-emitting element LD). Therefore, electrical stability of the light-emitting element LD may be secured.

In addition, because the insulating film INF is formed on the surface of the light-emitting element LD, a surface defect of the light-emitting element LD may be reduced or minimized, and lifespan and efficiency of the light-emitting element LD may be improved. Furthermore, because the insulating film INF is formed on the light-emitting element LD, even though a plurality of light-emitting elements LD are located in close proximity, an unwanted short circuit between the light-emitting elements LD may be reduced or prevented.

In some embodiments, the light-emitting element LD may be manufactured through a surface treatment process (for example, a coating process). For example, when a plurality of light-emitting elements LD are mixed in a fluid solution (or in a solvent), and are then supplied to each emission area (for example, to an emission area of each pixel), the light-emitting elements LD may be uniformly dispersed in the solution without being uniformly aggregated. Here, the emission area may be a region where light is emitted by the light-emitting elements LD, and may be distinguished from a non-emission area where light is not emitted.

The insulating film INF itself may be formed as a hydrophobic film using a hydrophobic material. Alternatively, a hydrophobic film formed of a hydrophobic material may be additionally formed on the insulating film INF. The hydrophobic material may be a material containing fluorine to exhibit hydrophobicity. In addition, the hydrophobic material may be applied to the light-emitting elements LD in a form of a self-assembled monolayer (SAM). In this case, the hydrophobic material may comprise octadecyl trichlorosilane, fluoroalkyl trichlorosilane, perfluoroalkyl triethoxysilane, or the like. In addition, the hydrophobic material may be a commercially available fluorine-containing material, such as Teflon™ or Cytop™, or a material corresponding thereto.

The light-emitting device including the light-emitting element LD may be used in various kinds of devices that require a light source, including a display device. For example, at least one micro light-emitting element LD (e.g., a plurality of micro light-emitting elements LD each having a size from nano scale to micro scale) may be located in each pixel area of the display panel, and the light source (or a light source unit) of each pixel may be configured using the micro light-emitting element LD. However, an application field of the light-emitting element LD is not limited to the display device in the present disclosure. For example, the light-emitting element LD may be used in other kinds of devices that require a light source, such as a lighting device.

Figure 4:
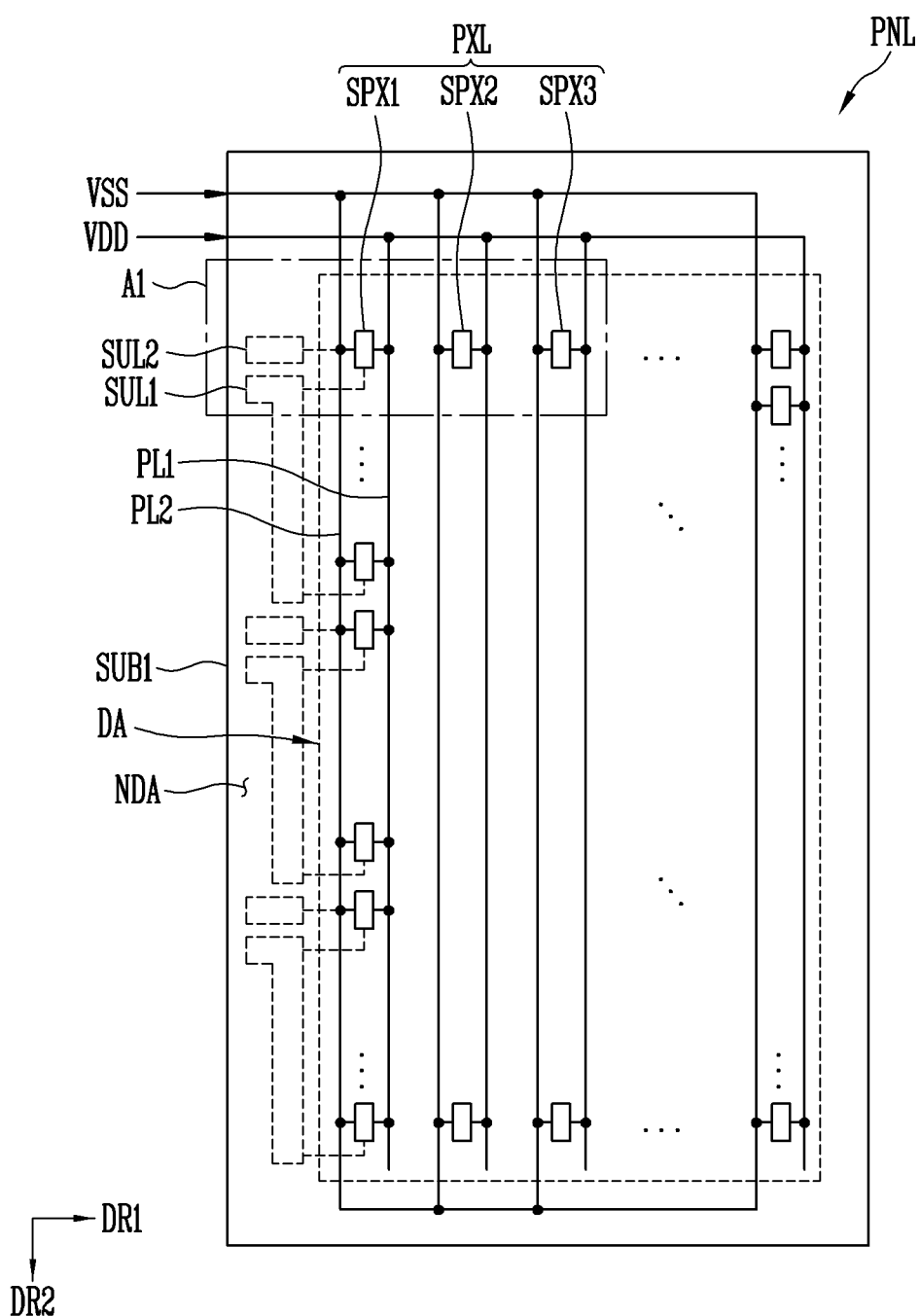
FIG. 4 is a plan view illustrating a display device according to some embodiments of the present disclosure.

FIG. 4 is a plan view illustrating a display device according to some embodiments of the disclosure. FIG. 4 shows a display panel PNL comprised in a display device, as an example of a device capable of using the light-emitting elements LD described with reference to FIGS. 1A to 3B as a light source. A structure of the display panel PNL is briefly shown based on a display area DA. However, according to some embodiments, at least one driving circuit unit (for example, at least one of a scan driver and a data driver) and/or the plurality of lines may be further located on the display panel PNL.

Referring to FIG. 4, the display panel PNL may comprise a base layer SUB1 (or a substrate), power lines PL1 and PL2, and a pixel PXL located on the base layer SUB1. The display panel PNL and the base layer SUB1 may comprise the display area DA in which an image is displayed, and a non-display area NDA that is separate from the display area DA.

The display area DA may be located in a center area of the display panel PNL, and the non-display area NDA may be located along an edge of the display panel PNL to entirely or partially surround the display area DA. However, positions of the display area DA and the non-display area NDA are not limited thereto, and the positions of the display area DA and the non-display area NDA may be changed.

The base layer SUB1 may configure a base member of the display panel PNL. For example, the base layer SUB1 may configure a base member of a lower panel (for example, a lower plate of the display panel PNL).

The base layer SUB1 may be a rigid substrate or a flexible substrate, and a material or a physical property of the base layer SUB1 is not particularly limited. For example, the base layer SUB1 may be a rigid substrate configured of glass or tempered glass, or a flexible substrate configured of a thin film of a plastic or metal material. In addition, the base layer SUB1 may be a transparent substrate, but is not limited thereto. For example, the base layer SUB1 may be a translucent substrate, an opaque substrate, or a reflective substrate.

One area on the base layer SUB1 may be defined as the display area DA where the pixels PXL are located, and a remaining area on the base layer SUB 1 may be defined as the non-display area NDA. For example, the base layer SUB1 may include the display area DA including a plurality of pixel areas in which the pixel PXL is formed, and the non-display area NDA located outside the display area DA. In the non-display area NDA, there may be located a first alignment line AL1, a second alignment line AL2, various lines connected to the pixels PXL of the display area DA, and/or an internal circuit unit.

Each of the first and second alignment lines AL1 and AL2 may be formed in a multilayer structure. Each of the first and second alignment lines AL1 and AL2 may have a multilayer structure including a main line and a sub line located at the same layer as at least one of the first and second pixel electrodes, which will be described later, and a sub line(s) SUL1 and SUL2. For example, as shown in FIG. 4, in the non-display area NDA, the first and second alignment lines AL1 and AL2 may be configured of only the sub lines SUL1 and SUL2. This will be described in detail with reference to FIGS. 6 to 8B.

A first power line PL1 may extend across the display area DA in a second direction DR2, and may be repeatedly arranged along a first direction DR1. The first power line PL1 may be a common line connected to all pixels PXL, and a first power VDD (or a first power voltage) may be applied to the first power line PL1.

Similarly, a second power line PL2 may extend across the display area DA in the second direction DR2, and may be repeatedly arranged along the first direction DR1. The second power line PL2 may be a common line, and a second power VSS (or a second power voltage) may be applied to the second power line PL2. Here, the first power VDD and the second power VSS may have different voltage levels. For example, the first power VDD may have a voltage level that is higher than that of the second power VSS.

The pixel PXL may comprise at least one light-emitting element LD that is electrically connected between the first power line PL1 and the second power line PL2, and that is driven by corresponding scan signals and data signals. For example, the pixel PXL may comprise at least one rod-shaped light-emitting diode according to any one of the embodiments of FIGS. 1 to 3B. For example, the pixel PXL may comprise a plurality of rod-shaped light-emitting diodes having a size that is as small as nano scale to micro scale, and being connected in parallel to each other between the first power line PL1 and the second power line PL2. The rod-shaped light-emitting diodes may configure the light source of the pixel PXL.

In addition, the pixel PXL may comprise a plurality of subpixels SPX1, SPX2, and SPX3. For example, the pixel PXL may comprise a first subpixel SPX1, a second subpixel SPX2, and a third subpixel SPX3.

The first to third subpixels SPX1, SPX2, and SPX3 may emit light in different colors. For example, the first subpixel SPX1 may be a red sub pixel for emitting red color, the second subpixel SPX2 may be a green sub pixel for emitting green color, and the third subpixel SPX3 may be a blue sub pixel for emitting blue color. However, a color, a type, the number, and/or the like of subpixels configuring the pixel PXL are/is not particularly limited. For example, the color of light emitted from each of the subpixels may be variously changed. FIG. 4 shows the pixels PXL are arranged in a stripe shape in the display area DA, but the disclosure is not limited thereto. For example, the pixels PXL may be located in various pixel array forms.

In some embodiments, the pixel PXL (or each of the subpixels) may be configured as an active pixel. However, a type, a structure, and/or a driving method of the pixel PXL applicable to the display device of embodiments of the present disclosure is not particularly limited. For example, the pixel PXL may be configured as a pixel of a display device having various passive or active structures.

Figure 5A:
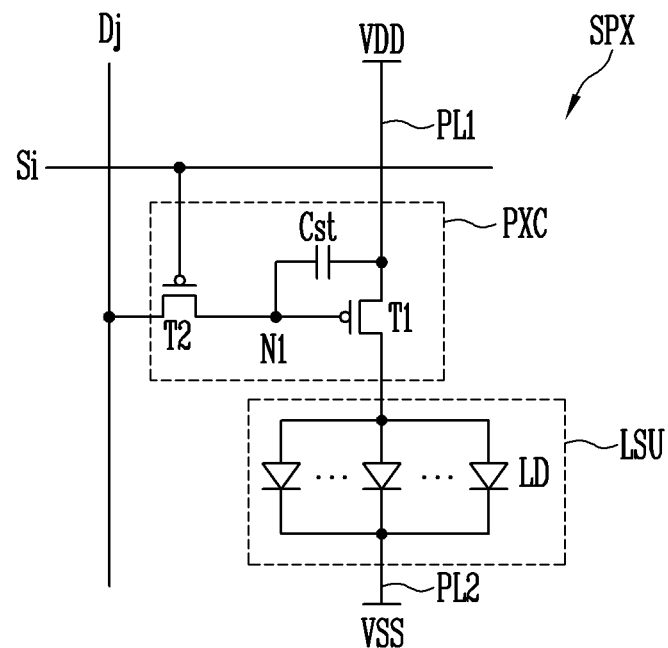
FIGS. 5A to 5C are circuit diagrams illustrating an example of a subpixel comprised in the display device of FIG. 4.
Figure 5B:
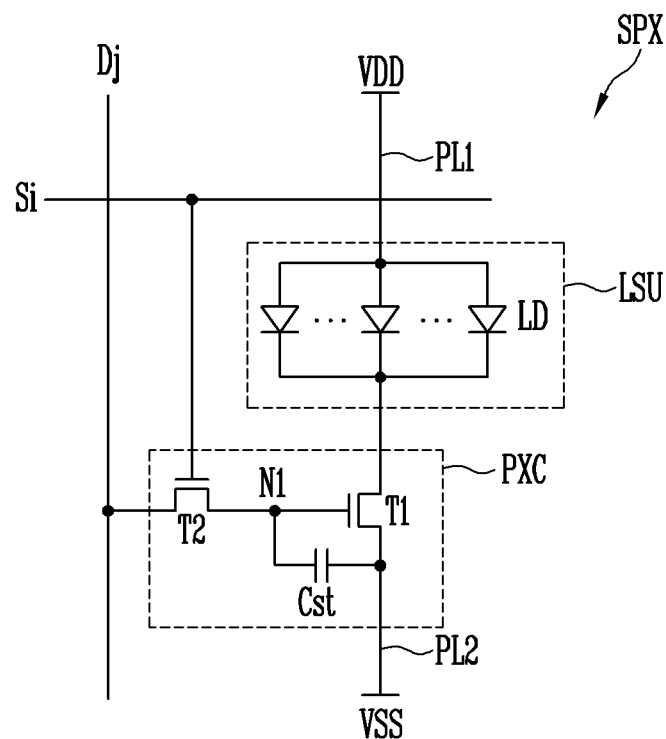
Figure 5C:
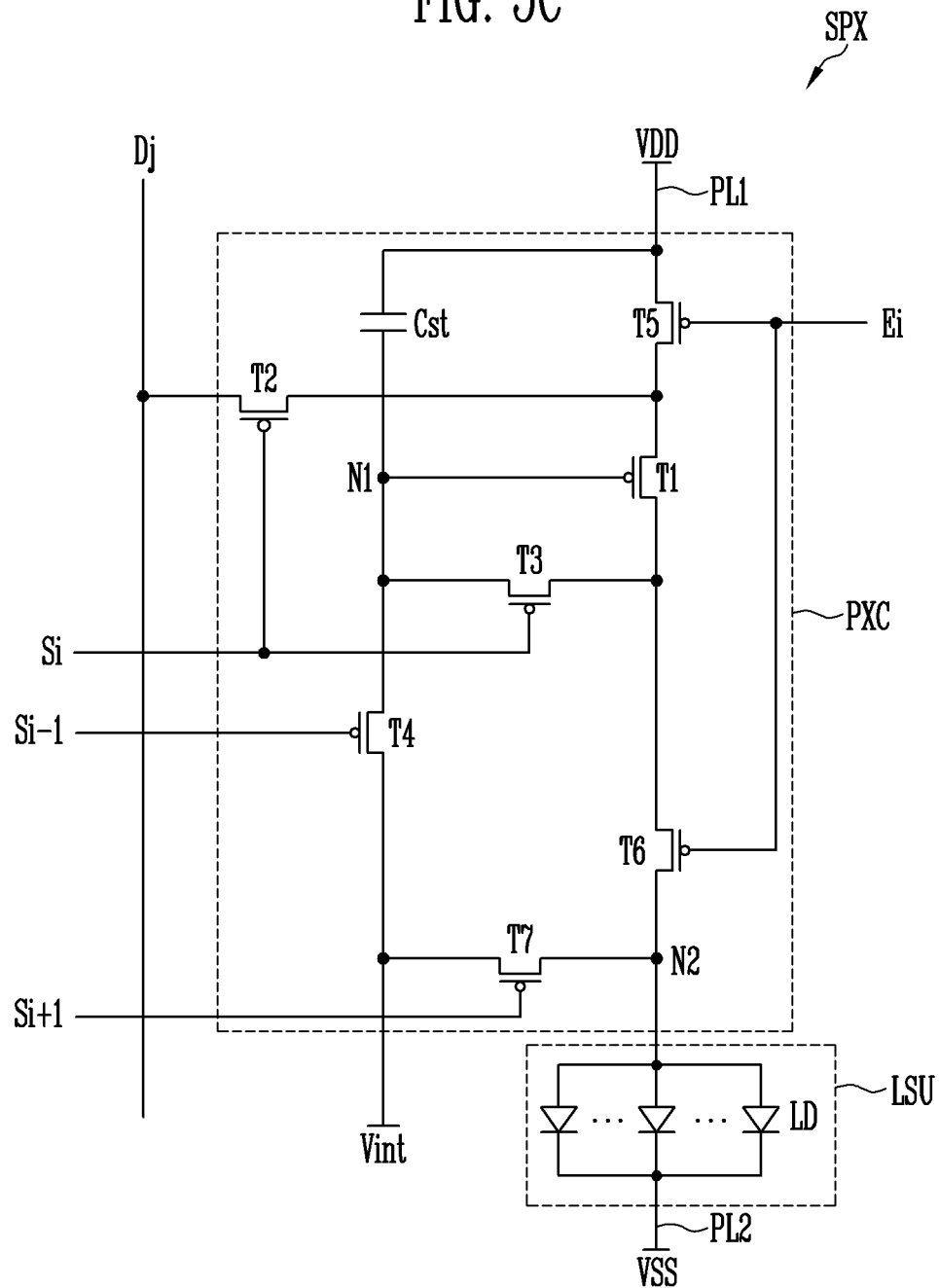

FIGS. 5A to 5C are circuit diagrams illustrating an example of the subpixel of the display device of FIG. 4. The subpixel SPX shown in FIGS. 5A to 5C may be any one of the first, second, and third subpixels SPX1, SPX2, and SPX3 provided in the display panel PNL of FIG. 4, and the first, second, and third subpixels SPX1, SPX2, and SPX3 may have substantially the same or similar structure. Therefore, in the description with reference to FIGS. 5A to 5C, the first, second, and third subpixels SPX1, SPX2, and SPX3 are collectively referred to as the subpixel SPX.

First, referring to FIG. 5A, the subpixel SPX comprises a light source unit LSU that emits light at a luminance corresponding to a data signal. In addition, the subpixel SPX may selectively further comprise a pixel circuit PXC for driving the light source unit LSU.

According to some embodiments, the light source unit LSU may comprise a plurality of light-emitting elements LD electrically connected between the first power VDD and the second power VSS. In some embodiments, the light-emitting elements LD may be connected in parallel to each other, but the disclosed embodiments are not limited thereto. For example, the plurality of light-emitting elements LD may be connected in a serial/parallel mixed structure between the first power VDD and the second power VSS.

The first power VDD and the second power VSS may have different potentials so that the light-emitting elements LD may emit light. For example, the first power VDD may be set as a high potential power, and the second power VSS may be set as a low potential power. Here, a potential difference between the first power VDD and the second power VSS may be set to be equal to or greater than a threshold voltage of the light-emitting elements LD during an emission period of the subpixel SPX.

Meanwhile, although FIG. 5A shows the light-emitting elements LD are connected in parallel to each other in the same direction (for example, a forward direction) between the first power VDD and the second power VSS, the embodiments of the present disclosure are not limited thereto. For example, some of the light-emitting elements LD may be connected in a first direction (for example, a forward direction) between the first power VDD and the second power VSS to form respective effective light sources, while one or more other light-emitting elements LD may be connected in a second direction (for example, a reverse direction). As another example, at least one subpixel SPX may comprise only a single light-emitting element LD (for example, a single effective light source connected in the forward direction between the first power VDD and the second power VSS).

One end portion of each of the light-emitting elements LD may be commonly connected to a corresponding pixel circuit PXC through the first electrode, and may be connected to the first power VDD through the pixel circuit PXC and the first power line PL1 (refer to FIG. 4). The other end portion of each of the light-emitting elements LD may be commonly connected to the second power VSS through the second electrode and the second power line PL2 (refer to FIG. 4).

The light source unit LSU may emit light at a luminance corresponding to a driving current supplied through the corresponding pixel circuit PXC. Therefore, an image (e.g., a predetermined image) may be displayed in the display area DA.

The pixel circuit PXC may be connected to a scan line Si and a data line Dj of a corresponding subpixel SPX. For example, when the subpixel SPX is located in an i-th row and a j-th column of the display area DA, the pixel circuit PXC of the subpixel SPX may be connected to an i-th scan line Si and a j-th data line Dj of the display area DA. The pixel circuit PXC may comprise first and second transistors T1 and T2 and a storage capacitor Cst.

The first transistor T1 (or a driving transistor) may be connected between the first power VDD and the light source unit LSU. A gate electrode of the first transistor T1 may be connected to a first node N1. The first transistor T1 may control a driving current supplied to the light source unit LSU in correspondence with a voltage of the first node N1.

The second transistor T2 (or a switching transistor) may be connected between the data line Dj and the first node N1. A gate electrode of the second transistor T2 may be connected to the scan line Si.

The second transistor T2 may be turned on in response to a scan signal of a gate-on voltage (for example, a low voltage) from the scan line Si to electrically connect the data line Dj and the first node N1 to each other.

A data signal of a corresponding frame may be supplied to the data line Dj every frame period, and the data signal may be transferred to the first node N1 via the second transistor T2. Therefore, a voltage corresponding to the data signal may be charged in the storage capacitor Cst.

One electrode of the storage capacitor Cst may be connected to the first power VDD, and another electrode may be connected to the first node N1. The storage capacitor Cst may charge the voltage corresponding to the data signal supplied to the first node N1 during each frame period, and may maintain the charged voltage until the data signal of the next frame is supplied.

Meanwhile, in FIG. 5A, the transistors of the pixel circuit PXC (e.g., the first and second transistors T1 and T2) are shown as P-type transistors, but the embodiments of the present disclosure are not limited thereto. For example, at least one of the first and second transistors T1 and T2 may be changed to an N-type transistor.

For example, as shown in FIG. 5B, both of the first and second transistors T1 and T2 may be N-type transistors. In this case, the gate-on voltage of the scan signal for writing the data signal, which is supplied to the data line Dj, to the subpixel SPX during each frame period may be a high level voltage. Similarly, the voltage of the data signal for turning on the first transistor T1 may be a voltage of a waveform that is opposite to that which is for turning on the first transistor T1 shown in FIG. 5A. For example, in FIG. 5B, a data signal may be increased to have a higher voltage level as a grayscale value to be expressed is increased.

A configuration and an operation of the subpixel SPX shown in FIG. 5B are substantially similar to those of the subpixel SPX of FIG. 5A, except that a connection position of some circuit elements, and voltage levels of control signals (for example, the scan signal and the data signal), are changed according to a respective transistor type. Therefore, detailed description of the subpixel SPX of FIG. 5B is omitted.

Meanwhile, the structure of the pixel circuit PXC is not limited to what is shown in FIGS. 5A and 5B. That is, the pixel circuit PXC may be configured as a pixel circuit of various structures and/or driving methods. For example, the pixel circuit PXC may be configured as shown in FIG. 5C.

Referring to FIG. 5C, the pixel circuit PXC may be further connected to at least one other scan line (or a control line) in addition to the corresponding scan line Si. For example, the pixel circuit PXC of the subpixel SPX located in the i-th row of the display area DA may be further connected to an (i−1)-th scan line Si−1 and/or an (i+1)-th scan line Si+1. In addition, the pixel circuit PXC may be further connected to another power in addition to the first power VDD and the second power VSS. For example, the pixel circuit PXC may also be connected to an initialization power Vint. The pixel circuit PXC may comprise first to seventh transistors T1 to T7 and a storage capacitor Cst.

The first transistor T1 may be connected between the first power VDD and the light source unit LSU. One electrode (for example, a source electrode) of the first transistor T1 may be connected to the first power VDD through the fifth transistor T5 and the first power line PL1, and another electrode (for example, a drain electrode) of the first transistor T1 may be connected to one electrode of the light source unit LSU (for example, the first electrode of the corresponding subpixel SPX) via the sixth transistor T6. A gate electrode of the first transistor T1 may be connected to a first node N1. The first transistor T1 may control the driving current supplied to the light source unit LSU in correspondence with a voltage of the first node N1.

The second transistor T2 may be connected between the data line Dj and the one electrode of the first transistor T1. A gate electrode of the second transistor T2 may be connected to the corresponding scan line Si. The second transistor T2 may be turned on when the scan signal of the gate-on voltage is supplied to the scan line Si to thereby electrically connect the data line Dj to the one electrode of the first transistor T1 to supply voltage levels of control signals. Therefore, when the second transistor T2 is turned on, the data signal supplied from the data line Dj may be transferred to the first transistor T1.

The third transistor T3 may be connected between the other electrode (for example, the drain electrode) of the first transistor T1 and the first node N1. A gate electrode of the third transistor T3 may be connected to the corresponding scan line Si. The third transistor T3 may be turned on when the scan signal of the gate-on voltage is supplied from the scan line Si to thereby connect the first transistor T1 in a diode form.

The fourth transistor T4 may be connected between the first node N1 and the initialization power Vint. A gate electrode of the fourth transistor T4 may be connected to a previous scan line, for example, the (i−1)-th scan line Si−1. The fourth transistor T4 may be turned on when the scan signal of the gate-on voltage is supplied to the (i−1)-th scan line Si−1 to thereby transfer a voltage of the initialization power Vint to the first node N1. Here, the voltage of the initialization power Vint may be equal to or less than a lowest voltage of the data signal.

The fifth transistor T5 may be connected between the first power VDD and the first transistor T1. A gate electrode of the fifth transistor T5 may be connected to a corresponding emission control line, for example, an i-th emission control line Ei. The fifth transistor T5 may be turned off when an emission control signal of a gate-off voltage (for example, a high voltage) is supplied to the emission control line Ei, and may be turned on in other cases.

The sixth transistor T6 may be connected between the first transistor T1 and the first electrode of the light source unit LSU. A gate electrode of the sixth transistor T6 may be connected to a corresponding emission control line, for example, the i-th emission control line Ei. The sixth transistor T6 may be turned off when the emission control signal of the gate-off voltage is supplied to the emission control line Ei, and may be turned on in other cases.

The seventh transistor T7 may be connected between the first electrode of the light source unit LSU and the initialization power Vint. A gate electrode of the seventh transistor T7 may be connected to any one of next scan lines, for example, the (i+1)-th scan line Si+1. The seventh transistor T7 may be turned on when the scan signal of the gate-on voltage is supplied to the (i+1)-th scan line Si+1 to supply the voltage of the initialization power Vint to the first electrode of the light source unit LSU. In this case, a voltage of the first electrode of the light source unit LSU may be initialized during each initialization period in which the voltage of the initialization power Vint is transferred to the light source unit LSU.

A control signal for controlling an operation of the seventh transistor T7 may be variously changed. For example, the gate electrode of the seventh transistor T7 may be connected to a scan line of a corresponding horizontal line, that is, the i-th scan line Si. In this case, the seventh transistor T7 may be turned on when the scan signal of the gate-on voltage is supplied to the i-th scan line Si to supply the voltage of the initialization power Vint to the one electrode of the light source unit LSU.

The storage capacitor Cst may be connected between the first power VDD and the first node N1. The storage capacitor Cst may store a data signal supplied to the first node N1 and a voltage corresponding to the threshold voltage of the first transistor T1 in each frame period.

Meanwhile, in FIG. 5C, all of the transistors of the pixel circuit PXC (e.g., the first to seventh transistors T1 to T7) are shown as P-type transistors, but the disclosed embodiments are not limited thereto. For example, at least one of the first to seventh transistors T1 to T7 may be changed to an N-type transistor.

In addition, a structure of the subpixel SPX that may be applied to the disclosure is not limited to the embodiments shown in FIGS. 5A to 5C, and the subpixel SPX may have various structures in other embodiments. For example, the pixel circuit PXC in the subpixel SPX may be configured as a pixel circuit of various structures and/or driving methods in other embodiments. In addition, the subpixel SPX may be configured in a passive light-emitting display device or the like. In this case, the pixel circuit PXC may be omitted, and each of the first and second electrodes of the light source unit LSU may be directly connected to the scan line Si, the data line Dj, the power line, the control line, and/or the like.

Figure 6:
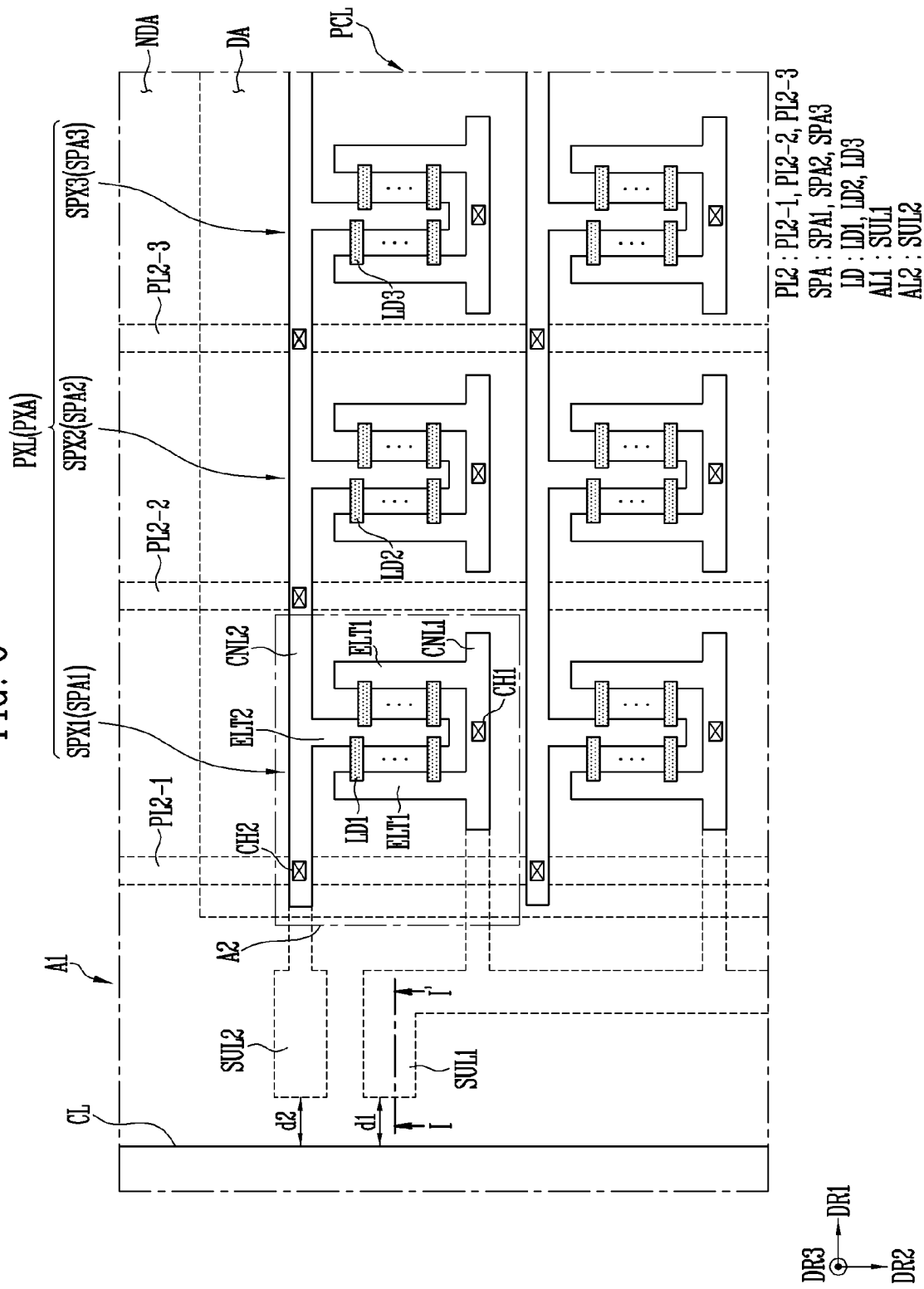
FIG. 6 is a plan view illustrating an example of the display device in which the first region A1 of FIG. 4 is enlarged.

FIG. 6 is a plan view illustrating an example of the display device in which the first region A1 of FIG. 4 is enlarged. FIG. 6 shows a structure of the pixel PXL based on the display element layer LDL and the pixel circuit layer PCL on which the light-emitting elements LD of the pixel PXL are located.

The pixel circuit layer PCL may be formed on the base layer SUB1 described with reference to FIG. 4, and may include the sub lines SUL1 and SUL2 of the first and second power lines PL1 and PL2, and the pixel circuit PXC described with reference to FIGS. 5A to 5C. As shown in FIG. 6, the pixel circuit layer PCL may include the first sub line SUL1, the second sub line SUL2, and the second power line PL2.

According to some embodiments of the disclosure, the alignment lines AL1 and AL2 may have a multilayer structure including the main line and the sub lines SUL1 and SUL2. Here, pixel electrodes ELT1 and ELT2 may be referred to as the main lines in an alignment operation of the light-emitting elements LD.

Figure 10:
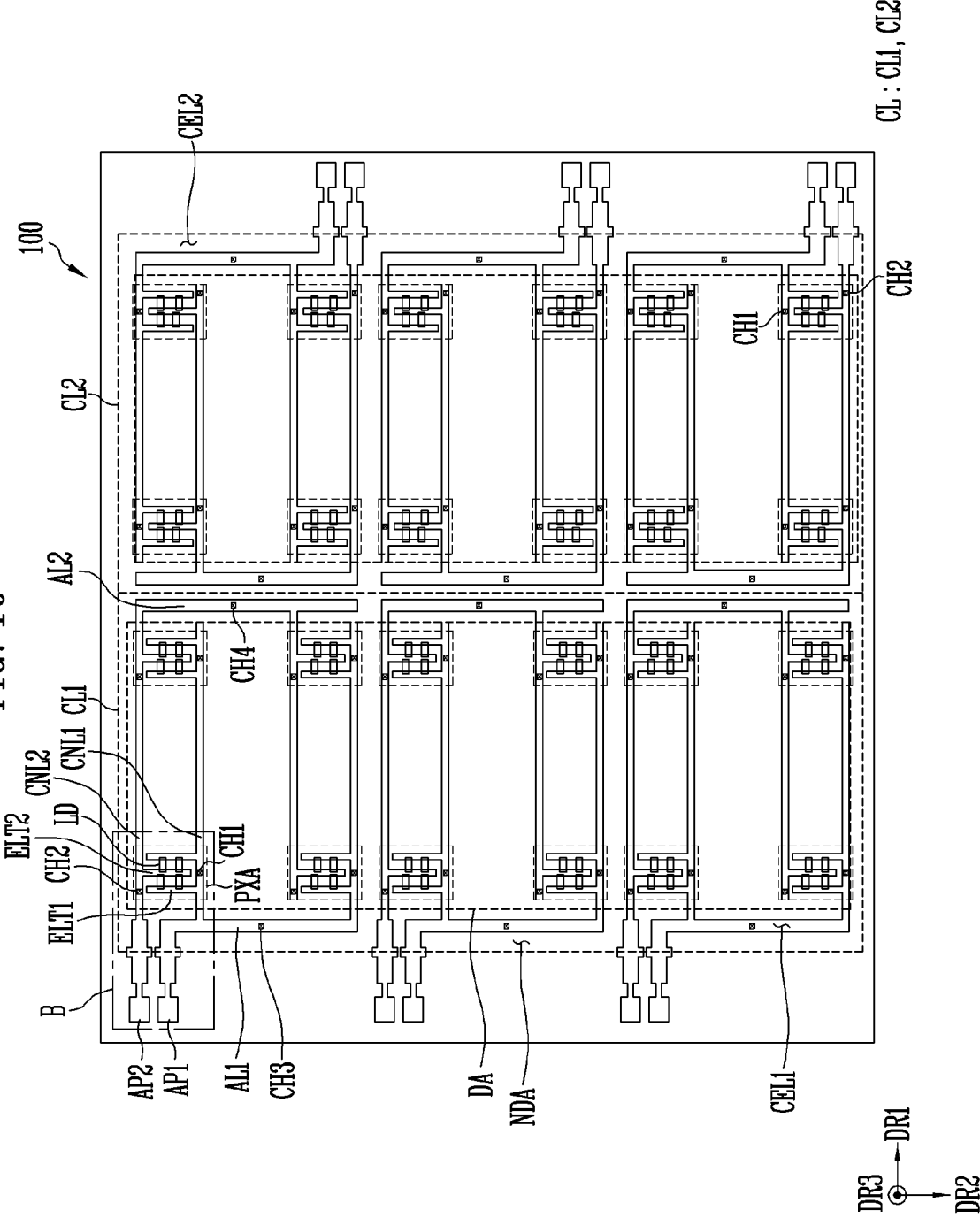
FIG. 10 is a diagram for describing an alignment line formed on a mother substrate.

The first alignment line AL1 may have the main line and the sub lines SUL1 and SUL2 electrically connected to each other through at least one third contact hole CH3 (refer to FIG. 10), and the second alignment line AL2 may have the main line and the sub lines SUL1 and SUL2 electrically connected to each other through at least one fourth contact hole CH4 (refer to FIG. 10). Here, a size, a shape, and/or the number of the third contact holes CH3 formed in the first alignment line AL1, and a size, a shape, and/or the number of the fourth contact holes CH4 formed in the second alignment line AL2 are/is not limited, and may be variously modified and implemented in other embodiments.

Each of the main lines may be formed simultaneously with the first and/or second pixel electrodes ELT1 and/or ELT2 so as to be formed at the same layer as the first and/or second pixel electrodes ELT1 and/or ELT2. In addition, each of the sub lines SUL1 and SUL2 may be located to overlap the main line under a corresponding main line. For example, each of the sub lines SUL1 and SUL2 may be formed (e.g., formed simultaneously) with at least one electrode formed in the pixel circuit layer so as to be located at the same layer as the at least one electrode.

As described above, when the first and second alignment lines AL1 and AL2 are formed in a multilayer structure, a resistance of the first and second alignment lines AL1 and AL2 may be effectively reduced. Therefore, in a subsequent alignment operation of the light-emitting elements LD, a voltage drop generated in each of the first and second alignment lines AL1 and AL2 may be reduced or minimized. Thus, in an operation of aligning the light-emitting elements LD, a desired alignment voltage may be transferred to the first and second pixel electrodes ELT1 and ELT2 of each pixel PXL.

In addition, when each of the first and second alignment lines AL1 and AL2 are formed in a multilayer structure to lower the resistance, a desired alignment voltage may be uniformly transferred to each of a plurality of cell regions CEL1 and CEL2 located on a mother substrate 100 shown in FIG. 10. Therefore, the light-emitting elements LD may be effectively aligned between each of the first and second pixel electrodes ELT1 and ELT2 while also performing the alignment process of the light-emitting elements LD for the plurality of cell regions CEL1 and CEL2 on the mother substrate 100. Therefore, quality and manufacturing efficiency of a light-emitting display device may be improved.

Referring to FIG. 6 again, the pixel PXL may be formed in the pixel area PXA. The pixel area PXA may comprise subpixel areas SPA1, SPA2, and SPA3 corresponding to the subpixels SPX1, SPX2, and SPX3 configuring the pixel PXL.

The pixel area PXA may comprise a first subpixel area SPA1 in which the first subpixel SPX1 is formed, a second subpixel area SPA2 in which the second subpixel SPX2 is formed, and a third subpixel area SPA3 in which the third subpixel SPX3 is formed. In each of the first to third subpixel areas SPA1, SPA2, and SPA3, there may be located at least one pair of first and second electrodes ELT1 and ELT2, and at least one light-emitting element LD connected between the first and second electrodes ELT1 and ELT2.

The first subpixel SPX1 may comprise a first electrode ELT1 and a second electrode ELT2 spaced apart from each other in the first subpixel area SPA1, and at least one first light-emitting element LD1 connected between the first and second electrodes ELT1 and ELT2. Similarly, the second subpixel SPX2 may comprise the first electrode ELT1 and the second electrode ELT2 spaced apart from each other in the second subpixel area SPA2, and at least one second light-emitting element LD2 connected between the first and second electrodes ELT1 and ELT2. The third subpixel SPX3 may comprise the first electrode ELT1 and the second electrode ELT2 spaced apart from each other in the third subpixel area SPA3, and at least one third light-emitting element LD3 connected between the first and second electrodes ELT1 and ELT2.

The first, second, and third light-emitting elements LD1, LD2, and LD3 may emit light of the same color or of different colors. For example, each of the first light-emitting elements LD1 may be a red light-emitting diode for emitting red light, each of the second light-emitting elements LD2 may be a green light-emitting diode for emitting green light, and each of the third light-emitting elements LD3 may be a blue light-emitting diode for emitting blue light.

As another example, all of the first, second, and third light-emitting elements LD1, LD2, and LD3 may be blue light-emitting diodes for emitting blue light. In this case, to configure a pixel PXL of a full-color, a light conversion layer and/or a color filter for converting the color of the light emitted from the corresponding subpixel SPX may be located on one or more of the first, second, and third subpixels SPX1, SPX2, and SPX3.

The first, second, and third subpixels SPX1, SPX2, and SPX3 may have substantially the same or similar structure. Hereinafter, for convenience of description, any one of the first, second, and third subpixels SPX1, SPX2, and SPX3 is comprehensively referred to as a subpixel SPX. Further, at least one of first, second, or the third light-emitting element LD1, LD2, or LD3 is comprehensively referred to as a light-emitting element LD, and the structure of the subpixel SPX will be described in detail hereinafter.

The first electrode ELT1 and the second electrode ELT2 may be arranged to be spaced apart from each other in each subpixel area SPA, and may be located so that the first electrode ELT1 and the second electrode ELT2 face each other in at least one area. For example, the first and second electrodes ELT1 and ELT2 may be arranged in parallel to be spaced apart from each other (e.g., by a predetermined distance) along the first direction DR1. Each of the first and second electrodes ELT1 and ELT2 may extend along the second direction DR2 crossing the first direction DR1. However, the disclosed embodiments are not limited thereto. For example, a shape, a mutual arrangement relationship, and/or the like of the first and second electrodes ELT1 and ELT2 may be variously changed in other embodiments.

The first electrode ELT1 may be electrically connected to a first connection electrode CNL1 (or a first connection line) extending in the first direction DR1. The first connection electrode CNL1 may be connected to the pixel circuit PXC (or the first transistor T1) described with reference to FIGS. 5A to 5C through a first contact hole CH1.

The second electrode ELT2 may be electrically connected to a second connection electrode CNL2 (or a second connection line) extending in the first direction DR1. The second connection electrode CNL2 may extend to an adjacent subpixel or subpixel area (for example, the second and third subpixels SPX2 and SPX3, or the second and third subpixel areas SPA2 and SPA3). The second connection electrode CNL2 may be electrically connected to the second power line PL2 (or to first to third sub power lines PL2-1, PL2-2, and PL2-3 comprised in the second power line PL2) through a second contact hole CH2.

Meanwhile, the first and second sub lines SUL1 and SUL2 may be located in the non-display area NDA. The first sub line SUL1 may generally extend along the second direction DR2. The first sub line SUL1 may also extend toward each of the plurality of subpixels SPX located adjacent to each other in the first direction DR1. For example, some regions of the first sub line SUL1 may be located to overlap a portion of the first connection electrode CNL1 of the first subpixel SPX1 in a third direction DR3. The first sub line SUL1 and the first connection electrode CNL1 may be electrically connected to each other in some regions.

The first sub line SUL1 may be bent and extended in the first direction DR1 in a region adjacent to the first subpixel SPX1. One end of the bent and extended first sub line SUL1 may be spaced apart from a cutting line CL by a distance (e.g., a predetermined distance) d1. The cutting line may be a cutting line formed in a process of separating the mother substrate 100 (refer to FIG. 10) into each of the cell regions CEL1 and CEL2 (refer to FIG. 10).

The second sub line SUL2 may extend along the first direction DR1 in a region adjacent to the first subpixel SPX1. The second sub line SUL2 may extend toward the first subpixel SPX1 that is adjacent to the second sub line SUL2 in the first direction DR1. Some regions of the second sub line SUL2 may overlap a portion of the second connection electrode CNL2 of the first subpixel SPX1 in a third direction DR3 (the third direction DR3 being substantially perpendicular to both the first and second directions DR1 and DR2). The second sub line SUL2 and the second connection electrode CNL2 may be electrically connected to each other in some regions.

One end of the second sub line SUL2 may be spaced apart from the cutting line CL by a distance (e.g., a predetermined distance) d2. The cutting line may be formed in a process for separating the mother substrate 100 (refer to FIG. 10) into each of the cell regions CEL1 and CEL2 (refer to FIG. 10).

The main line may be integrally formed on the pixel circuit layer PCL with the first and second pixel electrodes ELT1 and ELT2 and the first and second connection electrodes CNL1 and CNL2. However, after the self-alignment of the light-emitting elements LD is completed, the main line may be removed in a region not including the first and second pixel electrodes ELT1 and ELT2 and the first and second connection electrodes CNL1 and CNL2.

Figure 7:
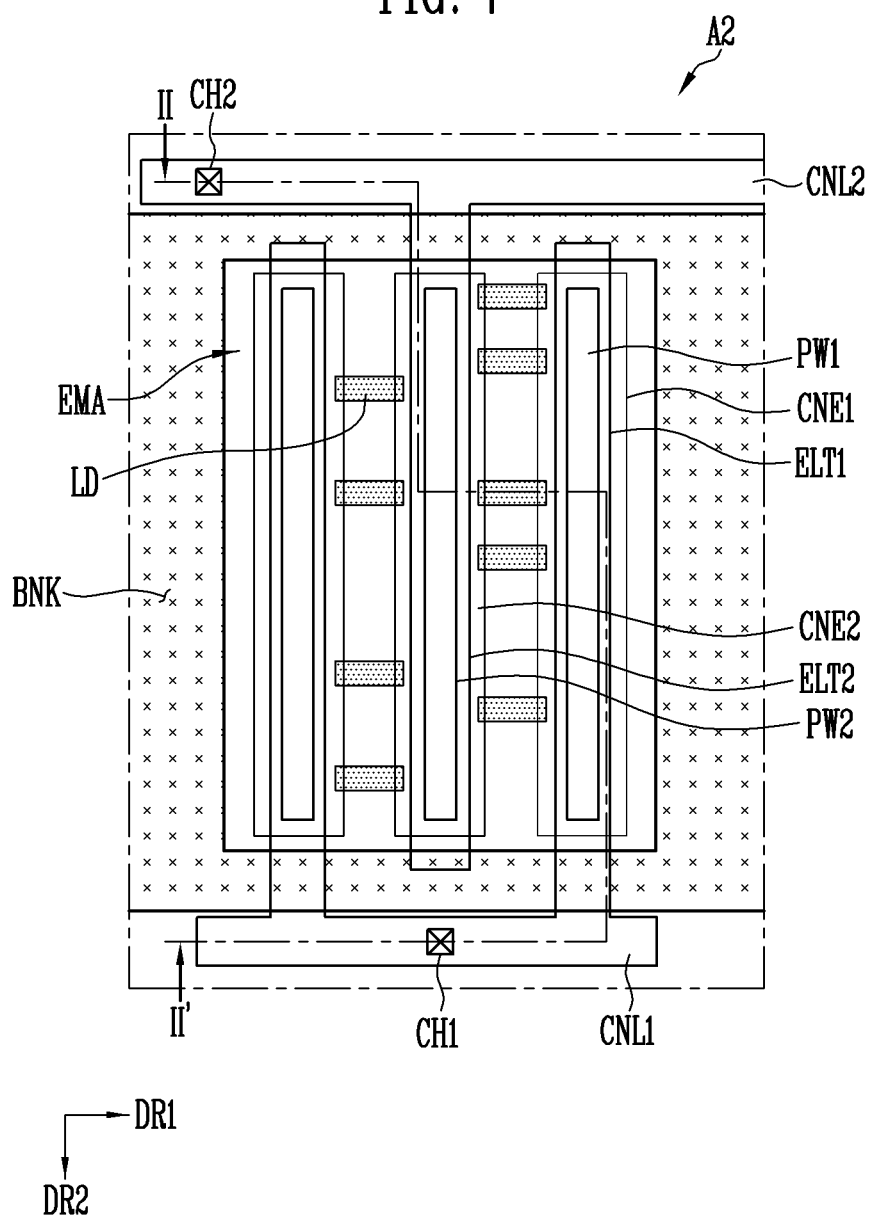
FIG. 7 is a plan view illustrating an example of the subpixel in which the second region A2 of FIG. 6 is enlarged.

FIG. 7 is a plan view illustrating an example of the subpixel in which the second region A2 of FIG. 6 is enlarged.

Referring to FIG. 7, the subpixel area SPA may comprise at least one pair of the first and second electrodes ELT1 and ELT2, and an emission area EMA in which at least one light-emitting element LD, which is connected between the first and second electrodes ELT1 and ELT2, is located.

According to some embodiments, the emission area EMA may be defined by a bank BNK surrounding the emission area EMA. Each of the first and second electrodes ELT1 and ELT2 may have a single layer structure or a multilayer structure. For example, the first electrode ELT1 may have a multilayer structure including a first reflective electrode and a first conductive capping layer, and the second electrode may have a multilayer structure including a second reflective electrode and a second conductive capping layer.

The first electrode ELT1 may be connected to the first connection electrode CNL1. The first electrode ELT1 may be integrally connected with the first connection electrode CNL1. For example, the first electrode ELT1 may be formed by branching at least one branch from the first connection electrode CNL1. When the first electrode ELT1 and the first connection electrode CNL1 are integrally formed, the first connection electrode CNL1 may be regarded as one region of the first electrode ELT1. However, the disclosed embodiments are not limited thereto. For example, in other embodiments of the disclosure, the first electrode ELT1 and the first connection electrode CNL1 may be formed separately from each other, and may be electrically connected to each other through at least one contact hole or via hole in other embodiments.

The first connection electrode CNL1 may have a single layer structure or a multilayer structure. For example, the first connection electrode CNL1 may comprise a first sub connection electrode integrally connected to the first reflective electrode, and a second sub connection electrode integrally connected to the first conductive capping layer. The first connection electrode CNL1 may have the same cross-sectional structure (or a stack structure) as the first electrode ELT1, but the disclosed embodiments are not limited thereto.

The first electrode ELT1 and the first connection electrode CNL1 may be connected to the pixel circuit PXC of the subpixel SPX, for example, the pixel circuit PXC shown in any one of FIGS. 5A to 5C, through the first contact hole CH1.

The first contact hole CH1 may be located outside the emission area EMA of the subpixel SPX. For example, the first contact hole CH1 may overlap the bank BNK, and may be located around the emission area EMA. In this case, while the first contact hole CH1 is covered by the bank BNK, visibility of a pattern in the emission area EMA may be reduced or prevented. However, the disclosure is not limited thereto. For example, in other embodiments of the disclosure, at least one first contact hole CH1 may be located inside the emission area EMA.

The pixel circuit PXC may be located under the light-emitting elements LD located in the corresponding subpixel area SPA. For example, each pixel circuit PXC may be formed in the pixel circuit layer (or in a circuit element layer including a circuit element such as a transistor) under the light-emitting elements LD, and may be connected to the first electrode ELT1 through the first contact hole CH1.

The second electrode ELT2 may be connected to the second connection electrode CNL2. For example, the second electrode ELT2 may be integrally connected with the second connection electrode CNL2. For example, the second electrode ELT2 may be formed by branching at least one branch from the second connection electrode CNL2. When the second electrode ELT2 and the second connection electrode CNL2 are integrally formed, the second connection electrode CNL2 may be regarded as one region of the second electrode ELT2. However, the disclosure is not limited thereto. For example, in other embodiments of the disclosure, the second electrode ELT2 and the second connection electrode CNL2 may be formed separately from each other, and may be electrically connected to each other through at least one contact hole or via hole.

Similar to the first connection electrode CNL1, the second connection electrode CNL2 may have a single layer structure or a multilayer structure.

The second electrode ELT2 and the second connection electrode CNL2 may be connected to the second power VSS (refer to FIG. 4). For example, the second electrode ELT2 and the second connection electrode CNL2 may be connected to the second power VSS through the second contact hole CH2 and the second power line PL2 (refer to FIG. 6) connected thereto.

The second contact hole CH2 may be located outside the emission area EMA of the subpixel SPX. For example, the second contact hole CH2 may overlap the bank BNK, and may be located around the emission area EMA. In this case, while the second contact hole CH2 is covered by the bank BNK, visibility of a pattern in the emission area EMA may be reduced or prevented. However, the disclosure is not limited thereto. For example, in other embodiments, at least one second contact hole CH2 may be located inside the emission area EMA.

One region of the second power line PL2 for supplying the second power VSS may be located in the pixel circuit layer under the light-emitting elements LD. For example, the second power line PL2 may be located in the pixel circuit layer PCL under the light-emitting elements LD, and may be connected to the second electrode ELT2 through the second contact hole CH2. However, the disclosure is not limited thereto, and a position of the second power line PL2 may be variously changed in other embodiments.

A first partition wall PW1 may overlap one region of the first electrode ELT1, and may be located under the first electrode ELT1. Also, a second partition wall PW2 may overlap one region of the second electrode ELT2, and may be located under the second electrode ELT2. The first and second partition walls PW1 and PW2 may be spaced apart from each other in the emission area EMA, and may protrude upwardly from a respective one of the first and second electrodes ELT1 and ELT2. For example, the first electrode ELT1 may be located on the first partition wall PW1 to protrude in a height direction (or a thickness direction or third direction DR3) of the base layer SUB1 from the first partition wall PW1. Similarly, the second electrode ELT2 may be located on the second partition wall PW2 to protrude from the second partition wall PW2 in the height direction of the base layer SUB1.

At least one light-emitting element LD, for example, a plurality of light-emitting elements LD may be arranged between the first and second electrodes ELT1 and ELT2 of the subpixel SPX. The plurality of light-emitting elements LD may be connected in parallel in the emission area EMA in which the first electrode ELT1 and the second electrode ELT2 are located to face each other.

In FIG. 7, the light-emitting elements LD are aligned in the first direction DR1, for example, in a horizontal direction, between the first and second electrodes ELT1 and ELT2. However, an arrangement direction of the light-emitting elements LD is not limited thereto. For example, at least one of the light-emitting elements LD may be arranged in an oblique direction (e.g., at an angle with respect to first direction DR1).

Each of the light-emitting elements LD may be electrically connected between the first and second electrodes ELT1 and ELT2 of the subpixel SPX. For example, a first end portion of each of the light-emitting elements LD may be electrically connected to the first electrode ELT1, and a second end portion of each of the light-emitting elements LD may be electrically connected to the second electrode ELT2.

In some embodiments, the first end portion of each of the light-emitting elements LD might not be directly located on the first electrode ELT1, and may be electrically connected to the first electrode ELT1 through at least one contact electrode, for example, through the first contact electrode CNE1. However, the disclosure is not limited thereto. For example, in other embodiments, the first end portion of the light-emitting elements LD may be in direct contact with the first electrode ELT1 to be electrically connected to the first electrode ELT1.

Similarly, the second end portion of each of the light-emitting elements LD might not be directly located on the second electrode ELT2, and may be electrically connected to the second electrode ELT2 through at least one contact electrode, for example, the second contact electrode CNE2. However, the disclosure is not limited thereto. For example, in other embodiments, the second end portion of each of the light-emitting elements LD may be in direct contact with the second electrode ELT2 to be electrically connected to the second electrode ELT2.

Each of the light-emitting elements LD may be a light-emitting diode having a small size, for example, nano scale to micro scale, using a material of an inorganic crystal structure. For example, each of the light-emitting elements LD may be a micro rod-shaped light-emitting diode having a size of nano scale to micro scale, as shown in any one of FIGS. 1A to 3B. However, a kind of the light-emitting elements LD that may be applied to the disclosure is not limited thereto. For example, the light-emitting element LD may be, for example, a light-emitting diode that is formed by a growth method and that has a core-shell structure having a size of nano scale to micro scale.

The light-emitting elements LD may be prepared in a dispersed form in a predetermined solution, and may be supplied to the emission area EMA of each subpixel SPX through an inkjet printing method, a slit coating method, or the like. For example, the light-emitting elements LD may be mixed with a volatile solvent and supplied to the emission area EMA. At this time, when a predetermined voltage is supplied to the first and second electrodes ELT1 and ELT2 of the subpixel SPX, an electric field is formed between the first and second electrodes ELT1 and ELT2 and thus, the light-emitting elements LD may be self-aligned between the first and second electrodes ELT1 and ELT2. After the light-emitting elements LD are aligned, the solvent is volatilized or removed in other methods, thereby stably arranging the light-emitting elements LD between the first and second electrodes ELT1 and ELT2. In addition, the first contact electrode CNE1 and the second contact electrode CNE2 are respectively formed on the first end portion and the second end portion of the light-emitting elements LD, thereby stably connecting the light-emitting elements LD between the first and second electrodes ELT1 and ELT2.

The first contact electrode CNE1 may be formed on the first end portion of the light-emitting elements LD and on at least one region of the first electrode ELT1 corresponding thereto, so as to physically and/or electrically connect a first end portion EP1 (see FIG. 8B) of the light-emitting elements LD to the first electrode ELT1. Similarly, the second contact electrode CNE2 may be formed on the second end portion of the light-emitting elements LD and on at least one region of the second electrode ELT2 corresponding thereto, so as to physically and/or electrically connect a second end portion EP2 (see FIG. 8B) of the light-emitting elements LD to the second electrode ELT2.

The light-emitting elements LD located in the subpixel area SPA may form a light source of the corresponding subpixel SPX. For example, when a driving current flows in at least one subpixel SPX during each frame period, the light-emitting elements connected in a forward direction between the first and second electrodes ELT1 and ELT2 of the subpixel SPX may emit light of a luminance corresponding to the driving current.

The emission area EMA may be surrounded by the bank BNK. For example, the bank BNK may be located between other subpixels so as to surround the emission area EMA of the subpixels SPX.

Figure 8A:
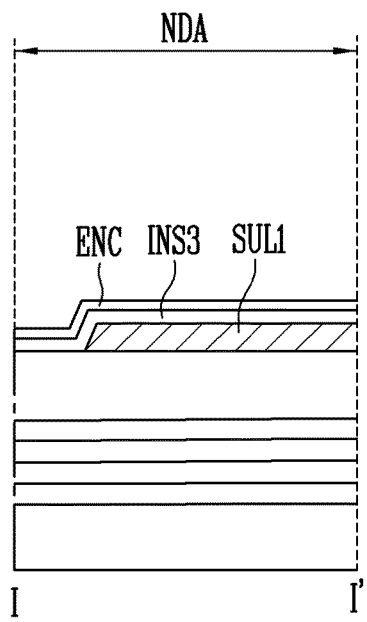
FIG. 8A is a diagram illustrating an example of the subpixel taken along the line I-I' of FIG. 6.
Figure 8B:
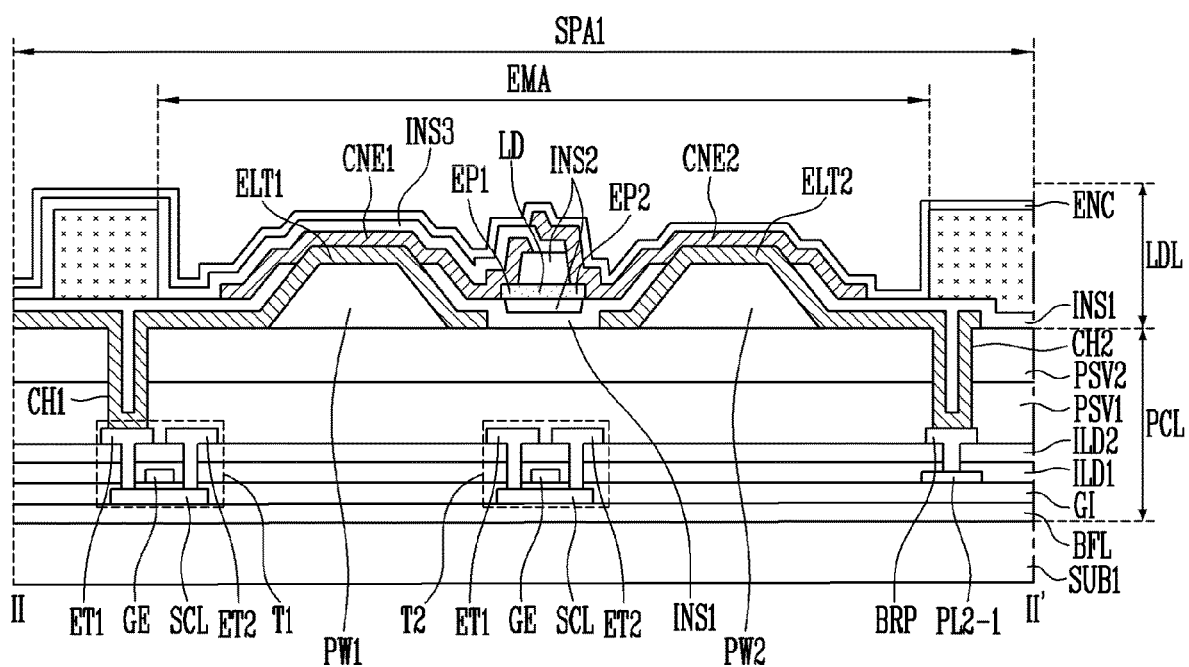
FIG. 8B is a cross-sectional view illustrating an example of the subpixel taken along the line II-II' of FIG. 7.

FIG. 8A is a diagram illustrating an example of the subpixel taken along the line I-I' of FIG. 6. FIG. 8B is a cross-sectional view illustrating an example of the subpixel taken along the line II-II' of FIG. 7.

FIGS. 8A and 8B show any one subpixel area SPA (for example, the first subpixel area SPA1) of the display panel PNL. According to some embodiments, the first, second, and third subpixels SPX1, SPX2, and SPX3 described above may have substantially the same or similar cross-sectional structures. Therefore, for convenience of description, the structure of each subpixel SPX will be comprehensively described through the cross section of the first subpixel area SPA1 corresponding to the line II-II' of FIG. 7.

Referring to FIGS. 8A and 8B, the pixel circuit layer PCL and the display element layer LDL may be sequentially located in each subpixel area SPA on the base layer SUB1.

According to some embodiments, the pixel circuit layer PCL and the display element layer LDL may be entirely formed in the display area DA of the display panel PNL. For example, the pixel circuit layer PCL may be formed on one surface of the base layer SUB1, and the display element layer LDL may be formed on one surface of the base layer SUB1 on which the pixel circuit layer PCL is formed.

The pixel circuit layer PCL may comprise circuit elements and the first and second sub lines SUL1 and SUL2 configuring the pixel circuit PXC of the subpixel SPX. The display element layer LDL may comprise the light-emitting elements LD of the subpixel SPX.

The pixel circuit layer PCL may comprise a plurality of circuit elements located in the display area DA. For example, the pixel circuit layer PCL may comprise a plurality of circuit elements formed in the subpixel area SPA to configure the pixel circuit PXC of the subpixel SPX. For example, the pixel circuit layer PCL may comprise a plurality of transistors located in the subpixel area SPA, for example, the first and second transistors T1 and T2 described with reference to FIGS. 5A and 5B. In addition, although not shown in FIGS. 8A and 8B, in some embodiments, the pixel circuit layer PCL may comprise the storage capacitor Cst located in the subpixel area SPA, various signal lines (for example, the scan line Si and the data line Dj described with reference to FIGS. 5A and 5B) connected to the pixel circuit PXC, and various power lines (for example, the first power line PL1 and the second power line PL2 for transferring the first power VDD and the second power VSS, respectively) connected to the pixel circuit PXC and/or the light-emitting elements LD.

The plurality of transistors comprised in the pixel circuit PXC, for example, the first and second transistors T1 and T2, may have substantially the same or similar cross-sectional structure. However, the disclosure is not limited thereto, and in another embodiment, at least some of the plurality of transistors may have different types and/or structures.

The pixel circuit layer PCL may comprise a plurality of insulating layers. For example, the pixel circuit layer PCL may comprise a buffer layer BFL, a gate insulating film GI, first and second interlayer insulating films ILD1 and ILD2, and first and second passivation films PSV1 and PSV2 that are sequentially stacked on one surface of the base layer SUB1.

The buffer layer BFL may reduce or prevent impurities diffusing into a circuit element. The buffer layer BFL may be configured of a single layer, or may be configured of multiple layers of at least two layers. When the buffer layer BFL is provided in multiple layers, each layer may be formed of the same material or different materials. In other embodiments, the buffer layer BFL may be omitted.

Each of the first and second transistors T1 and T2 may comprise a semiconductor layer SCL, a gate electrode GE, a first transistor electrode ET1, and a second transistor electrode ET2. Meanwhile, in FIG. 8B, the first and second transistors T1 and T2 comprise the first transistor electrode ET1 and the second transistor electrode ET2 formed separately from the semiconductor layer SCL. However, the disclosure is not limited thereto. For example, in other embodiments of the disclosure, the first and/or second transistor electrodes ET1 and/or ET2 comprised in at least one transistor located in each subpixel area SPA may be configured integrally with each semiconductor layer SCL.

The semiconductor layer SCL may be located on the buffer layer BFL. For example, the semiconductor layer SCL may be located between the base layer SUB1 on which the buffer layer BFL is formed and the gate insulating film GI. The semiconductor layer SCL may comprise a first region that is in contact with the first transistor electrode ET1, a second region that is in contact with the second transistor electrode ET2, and a channel region positioned between the first and second regions. One of the first and second regions may be a source region, and the other may be a drain region.

The semiconductor layer SCL may be a semiconductor pattern formed of polysilicon, amorphous silicon, an oxide semiconductor, or the like. In addition, the channel region of the semiconductor layer SCL may be an intrinsic semiconductor as a semiconductor pattern that is not doped with an impurity, and the first and second regions of the semiconductor layer SCL may be semiconductor patterns doped (e.g., doped with a predetermined impurity), respectively.

The gate electrode GE may be located on the semiconductor layer SCL with the gate insulating film GI interposed therebetween. For example, the gate electrode GE may be located to overlap at least one region of the semiconductor layer SCL between the gate insulating film GI and the first interlayer insulating film ILD1.

The first and second transistor electrodes ET1 and ET2 may be located on the semiconductor layer SCL and on the gate electrode GE with at least one of the first and second interlayer insulating films ILD1 and ILD2 interposed therebetween. For example, the first and second transistor electrodes ET1 and ET2 may be located between the second interlayer insulating film ILD2 and the first passivation film PSV1. The first and second transistor electrodes ET1 and ET2 may be electrically connected to the semiconductor layer SCL. For example, the first and second transistor electrodes ET1 and ET2 may be connected to the first region and the second region of the semiconductor layer SCL through contact holes passing through the gate insulating film GI and the first and second interlayer insulating films ILD1 and ILD2, respectively.

Meanwhile, any one of the first and second transistor electrodes ET1 and ET2 of at least one transistor (for example, the first transistor T1 shown in FIGS. 5A and 5B) comprised in the pixel circuit PXC may be electrically connected to the first electrode ELT1 of the light source unit LSU located on the second passivation film PSV2 through the first contact hole CH1 passing through the first and second passivation films PSV1 and PSV2.

At least one signal line and/or power line connected to the subpixel SPX may be located at the same layer as one electrode of the circuit elements of the pixel circuit PXC.

For example, the second power line PL2 for supplying the second power VSS may be located at the same layer as the gate electrode GE of each of the first and second transistors T1 and T2, and may be electrically connected to the second electrode ELT2 of the light source unit LSU, which is located on the first and second passivation films PSV1 and PSV2, through at least one second contact hole CH2 and through a bridge pattern BRP located at the same layer as the first and second transistor electrodes ET1 and ET2. However, a structure and/or a position of the second power line PL2 and the like may be variously changed in other embodiments.

The display element layer LDL may comprise the first and second partition walls PW1 and PW2, the first and second electrodes ELT1 and ELT2, a first insulating layer INS1, the light-emitting elements LD, a second insulating layer INS2, the first and second contact electrodes CNE1 and CNE2, a third insulating layer INS3, and an encapsulation film ENC, which are sequentially located and/or formed on the pixel circuit layer PCL.

The first and second partition walls PW1 and PW2 may be located on the pixel circuit layer PCL. The first and second partition walls PW1 and PW2 may be spaced apart from each other in the emission area EMA. The first and second partition walls PW1 and PW2 may protrude in the height direction on the pixel circuit layer PCL. The first and second partition walls PW1 and PW2 may have substantially the same height, but are not limited thereto.

The first partition wall PW1 may be located between the pixel circuit layer PCL and the first electrode ELT1. The first partition wall PW1 may be located to be adjacent to the first end portions EP1 of the light-emitting elements LD. For example, one side surface of the first partition wall PW1 may be located at a distance from the first end portions EP1 of the light-emitting elements LD, and may face the first end portions EP1 at a distance.

The second partition wall PW2 may be located between the pixel circuit layer PCL and the second electrode ELT2. The second partition wall PW2 may be located to be adjacent to the second end portions EP2 of the light-emitting elements LD. For example, one side surface of the second partition wall PW2 may be located at a distance adjacent to the second end portions EP2 of the light-emitting elements LD to face the second end portions EP2.

The first and second partition walls PW1 and PW2 may have various shapes. For example, the first and second partition walls PW1 and PW2 may have a trapezoidal cross-sectional shape that becomes narrower toward an upper portion as shown in FIG. 8B. In this case, each of the first and second partition walls PW1 and PW2 may have an inclined surface on at least one side surface. As another example, the first and second partition walls PW1 and PW2 may have a cross-section of a semi-circle or semi-ellipse that becomes narrower toward an upper portion. In this case, each of the first and second partition walls PW1 and PW2 may have a curved surface on at least one side surface. That is, in the disclosure, the shape of the first and second partition walls PW1 and PW2 is not particularly limited, and may be variously changed. In addition, at least one of the first and second partition walls PW1 and PW2 may be omitted or a position thereof may be changed.

The first and second partition walls PW1 and PW2 may comprise an insulating material including an inorganic material and/or an organic material. For example, the first and second partition walls PW1 and PW2 may comprise an inorganic film of at least one layer including various inorganic insulating materials, including $SiN_x$, $SiO_x$, or the like.

Alternatively, the first and second partition walls PW1 and PW2 may comprise at least one organic film, a photoresist film, and/or the like of at least one layer including various organic insulating materials, or may be configured of an insulator of a single layer or multiple layers including an organic/inorganic material in combination. That is, the configuration material of the first and second partition walls PW1 and PW2 may be variously changed.

In some embodiments, the first and second partition walls PW1 and PW2 may function as reflective members. For example, the first and second partition walls PW1 and PW2 may function as reflective members that generally guide the light emitted from each of the light-emitting elements LD to a desired direction to improve light efficiency of the pixel PXL, together with the first and second electrodes ELT1 and ELT2 provided thereon.

The first and second electrodes ELT1 and ELT2 may be located on the first and second partition walls PW1 and PW2, respectively. The first and second electrodes ELT1 and ELT2 may be spaced apart from each other in the emission area EMA.

The first and second electrodes ELT1 and ELT2 located on the first and second partition walls PW1 and PW2, respectively, may have a shape corresponding to the shape of the first and second partition walls PW1 and PW2, respectively. For example, the first and second electrodes ELT1 and ELT2 may have inclined surfaces or curved surfaces corresponding to shapes of the first and second partition walls PW1 and PW2, respectively, and may protrude in the height direction (or a thickness direction) of the pixel circuit layer PCL.

Each of the first and second electrodes ELT1 and ELT2 may comprise at least one conductive material. For example, each of the first and second electrodes ELT1 and ELT2 may comprise at least one material among a metal such as Ag, Mg, Al, Pt, Pd, Au, Ni, Nd, Ir, Cr, Ti, or an alloy thereof, a conductive oxide such as ITO, IZO, ZnO, or ITZO, and a conductive polymer such as PEDOT, but is not limited thereto.

In addition, each of the first and second electrodes ELT1 and ELT2 may be configured as a single layer or multiple layers. For example, each of the first and second electrodes ELT1 and ELT2 may comprise at least one reflective electrode layer. In addition, each of the first and second electrodes ELT1 and ELT2 may selectively further comprise at least one of a transparent electrode layer of one or more layers respectively located on and/or under a reflective electrode layer, and a conductive capping layer of at least one layer covering an upper portion of the reflective electrode layer and/or the transparent electrode layer.

Each of the reflective electrode layers of the first and second electrodes ELT1 and ELT2 may be configured of a conductive material having a uniform reflectance. For example, the reflective electrode layer may comprise at least one of metals such as Ag, Mg, Al, Pt, Pd, Au, Ni, Nd, Ir, Cr, and an alloy thereof, but is not limited thereto. That is, the reflective electrode layer may be configured of various reflective conductive materials. When each of the first and second electrodes ELT1 and ELT2 comprises the reflective electrode layer, the light emitted from both ends (e.g., from the first and second end portions EP1 and EP2) of each of the light-emitting elements LD may be further progressed or guided in a direction in which an image is displayed (for example, generally in a front surface direction). For example, when the first and second electrodes ELT1 and ELT2 have the inclined surfaces or the curved surfaces corresponding to the shape of the first and second partition walls PW1 and PW2, respectively, and are located to face the end portions EP1 and EP2 of the light-emitting elements LD, the light emitted from the first and second end portions EP1 and EP2 of each of the light-emitting elements LD may be reflected by the first and second electrodes ELT1 and ELT2, and may be further progressed or directed toward the front surface direction of the display panel PNL (for example, an upper direction of the base layer SUB1). Therefore, efficiency of the light emitted from the light-emitting elements LD may be improved.

In addition, the transparent electrode layers of each of the first and second electrodes ELT1 and ELT2 may be configured of various transparent electrode materials. For example, the transparent electrode layer may comprise ITO, IZO, or ITZO, but is not limited thereto. In some embodiments, each of the first and second electrodes ELT1 and ELT2 may be configured of a triple layer having a stack structure of ITO/Ag/ITO. As described above, when the first and second electrodes ELT1 and ELT2 are configured of multiple layers of at least two or more layers, a voltage drop due to a signal delay may be reduced or minimized. Therefore, a desired voltage may be effectively transferred to the light-emitting elements LD.

In addition, when each of the first and second electrodes ELT1 and ELT2 comprises a conductive capping layer covering the reflective electrode layer and/or the transparent electrode layer, the reflective electrode layer and the like of the first and second electrodes ELT1 and ELT2 may be reduced or prevented from being damaged due to a defect generated during a manufacturing process of the pixel PXL, or the like. However, the conductive capping layer may be selectively comprised in the first and second electrodes ELT1 and ELT2, and may be omitted in other embodiments. In addition, the conductive capping layer may be regarded as a component of each of the first and second electrodes ELT1 and ELT2, or may be regarded as a separate component located on the first and second electrodes ELT1 and ELT2.

The first insulating layer INS1 may be located on one region of the first and second electrodes ELT1 and ELT2. For example, the first insulating layer INS1 may be formed to cover the one region of the first and second electrodes ELT1 and ELT2, and may comprise an opening portion that exposes another region of the first and second electrodes ELT1 and ELT2.

In some embodiments, firstly, the first insulating layer INS1 may be formed to entirely cover the first and second electrodes ELT1 and ELT2. After the light-emitting elements LD are supplied and aligned on the first insulating layer INS1, as shown in FIG. 7, the first insulating layer INS1 may be partially opened to expose the first and second electrodes ELT1 and ELT2 at predetermined portions of the top surface of each of the first and second partition walls PW1 and PW2. Alternatively, after the supply and the alignment of the light-emitting elements LD are completed, the first insulating layer INS1 may be patterned in a form of an individual pattern that is locally located under the light-emitting elements LD.

That is, the first insulating layer INS1 may be interposed between the first and second electrodes ELT1 and ELT2 and the light-emitting elements LD, and may expose at least one region of each of the first and second electrodes ELT1 and ELT2. The first insulating layer INS1 may be formed to cover the first and second electrodes ELT1 and ELT2 after the first and second electrodes ELT1 and ELT2 are formed to thereby reduce or prevent damage of the first and second electrodes ELT1 and ELT2 and/or extraction of metal in a subsequent process. In addition, the first insulating layer INS1 may stably support each of the light-emitting elements LD. In other embodiments, the first insulating layer INS1 may be omitted.

The light-emitting elements LD may be supplied and aligned in the emission area EMA in which the first insulating layer INS1 is formed. For example, the light-emitting elements LD may be supplied to the emission area EMA through an inkjet method or the like, and the light-emitting elements LD may be aligned between the first and second electrodes ELT1 and ELT2 by an alignment voltage (e.g., a predetermined alignment voltage or an alignment signal) applied to the first and second electrodes ELT1 and ELT2. As will be described later, for the alignment of the light-emitting elements LD, a reference voltage (for example, a ground voltage) may be applied to the second electrode ELT2, and a predetermined AC voltage may be applied to the first electrode ELT1. An electric field is formed between the first and second electrodes ELT1 and ELT2, and the light-emitting elements LD may be self-aligned between the first and second electrodes ELT1 and ELT2 of the emission area EMA.

The bank BNK may be located on the first insulating layer INS1. For example, the bank BNK may be formed between other subpixels so as to surround the emission area EMA of the subpixel SPX, to form a pixel definition film that divides the emission area EMA of the subpixel SPX.

The bank BNK may be formed to have a second height that is higher than a first height of the first and second partition walls PW1 and PW2. In this case, the bank BNK may function as a dam structure that that reduces or prevents the solution in which the light-emitting elements LD are mixed from flowing into the emission area EMA of the adjacent subpixel SPX, or that controls an amount (e.g., a predetermined amount) of solution to be supplied to each emission area EMA, in an operation of supplying the light-emitting elements LD to each emission area EMA.

The bank BNK may be formed to block inflow of light, which is emitted from each emission area EMA, to an adjacent emission area EMA and generation of light interference. To this end, the bank BNK may be formed to block the light emitted from the light-emitting elements LD of each subpixel SPX from passing through the bank BNK.

The second insulating layer INS2 may be located on the light-emitting elements LD (e.g., the light-emitting elements LD arranged between the first and second electrodes ELT1 and ELT2), and may expose the first and second end portions EP1 and EP2 of the light-emitting elements LD. For example, the second insulating layer INS2 might not cover the first and second end portions EP1 and EP2 of the light-emitting elements LD, and may be partially located on only one region of the light-emitting elements LD. The second insulating layer INS2 may be formed in an independent pattern on each emission area EMA, but is not limited thereto. In addition, as shown in FIG. 7, when a space is present between the first insulating layer INS1 and the light-emitting elements LD before formation of the second insulating layer INS2, the space may be filled by the second insulating layer INS2. Therefore, the light-emitting elements LD may be supported more stably.

The first and second contact electrodes CNE1 and CNE2 may be respectively located on the first and second electrodes ELT1 and ELT2 and the first and second end portions EP1 and EP2 of the light-emitting elements LD. In some embodiments, as shown in FIG. 7, the first and second contact electrodes CNE1 and CNE2 may be located at the same layer. In this case, the first and second contact electrodes CNE1 and CNE2 may be formed using the same conductive material in the same process, but are not limited thereto.

The first and second contact electrodes CNE1 and CNE2 may electrically connect the first and second end portions EP1 and EP2 of the light-emitting elements LD to the first and second electrodes ELT1 and ELT2, respectively.

For example, the first contact electrode CNE1 may be located in the subpixel area SPA in which the second insulating layer INS2 is located. The first contact electrode CNE1 may be located on the first electrode ELT1 to be in contact with one region of the first electrode ELT1 located in the corresponding subpixel area SPA. In addition, the first contact electrode CNE1 may be located on the first end portion EP1 to be in contact with the first end portion EP1 of the at least one light-emitting element LD located in the corresponding subpixel area SPA. The first end portion EP1 of the at least one light-emitting element LD located in the subpixel area SPA may be electrically connected to the first electrode ELT1 located in the corresponding subpixel area SPA via the first contact electrode CNE1.

The third insulating layer INS3 may be located in the subpixel area SPA in which the first contact electrode CNE1 is located. The third insulating layer INS3 may cover the second insulating layer INS2, the first contact electrode CNE1, and the bank BNK located in the corresponding subpixel area SPA.

Similar to the first and second insulating layers INS1 and INS2, the third insulating layer INS3 may be configured of a single layer or multiple layers, and may comprise at least one inorganic insulating material and/or an organic insulating material. For example, the third insulating layer INS3 may comprise various kinds of organic/inorganic insulating materials, including SiNx. In addition, the third insulating layer INS3 may comprise an insulating material different from that of the first and second insulating layers INS1 and INS2, or may comprise an insulating material the same as at least some of the first and second insulating layers INS1 and INS2.

The second contact electrode CNE2 may be located in each subpixel area SPA in which the third insulating layer INS3 is located. The second contact electrode CNE2 may be located on the second electrode ELT2 to be in contact with one region of the second electrode ELT2 located in the corresponding subpixel area SPA. In addition, the second contact electrode CNE2 may be located on the second end portion EP2 to be in contact with the second end portion EP2 of the at least one light-emitting element LD located in the corresponding subpixel area SPA. The second end portion EP2 of the at least one light-emitting element LD located in each subpixel area SPA may be electrically connected to the second electrode ELT2 located in the corresponding subpixel area SPA via the second contact electrode CNE2.

The encapsulation film ENC may be formed on, or located on, the surface of the base layer SUB1 on which the first and second partition walls PW1 and PW2, the first and second electrodes ELT1 and ELT2, the light-emitting elements LD, the first and second contact electrodes CNE1 and CNE2, and the bank BNK are formed, so as to thereby cover the first and second partition walls PW1 and PW2, the first and second electrodes ELT1 and ELT2, the light-emitting elements LD, the first and second contact electrodes CNE1 and CNE2, and the bank BNK. The encapsulation film ENC may be an inorganic insulating film including an inorganic material or an organic insulating film including an organic material. For example, the encapsulation film ENC may have a structure in which at least one inorganic film and at least one organic film are alternately stacked. In addition, in other embodiments, an overcoat layer of at least one layer may be further located on the third insulating layer INS3. The non-display area NDA will be described later with reference to FIG. 12.

Figure 11:
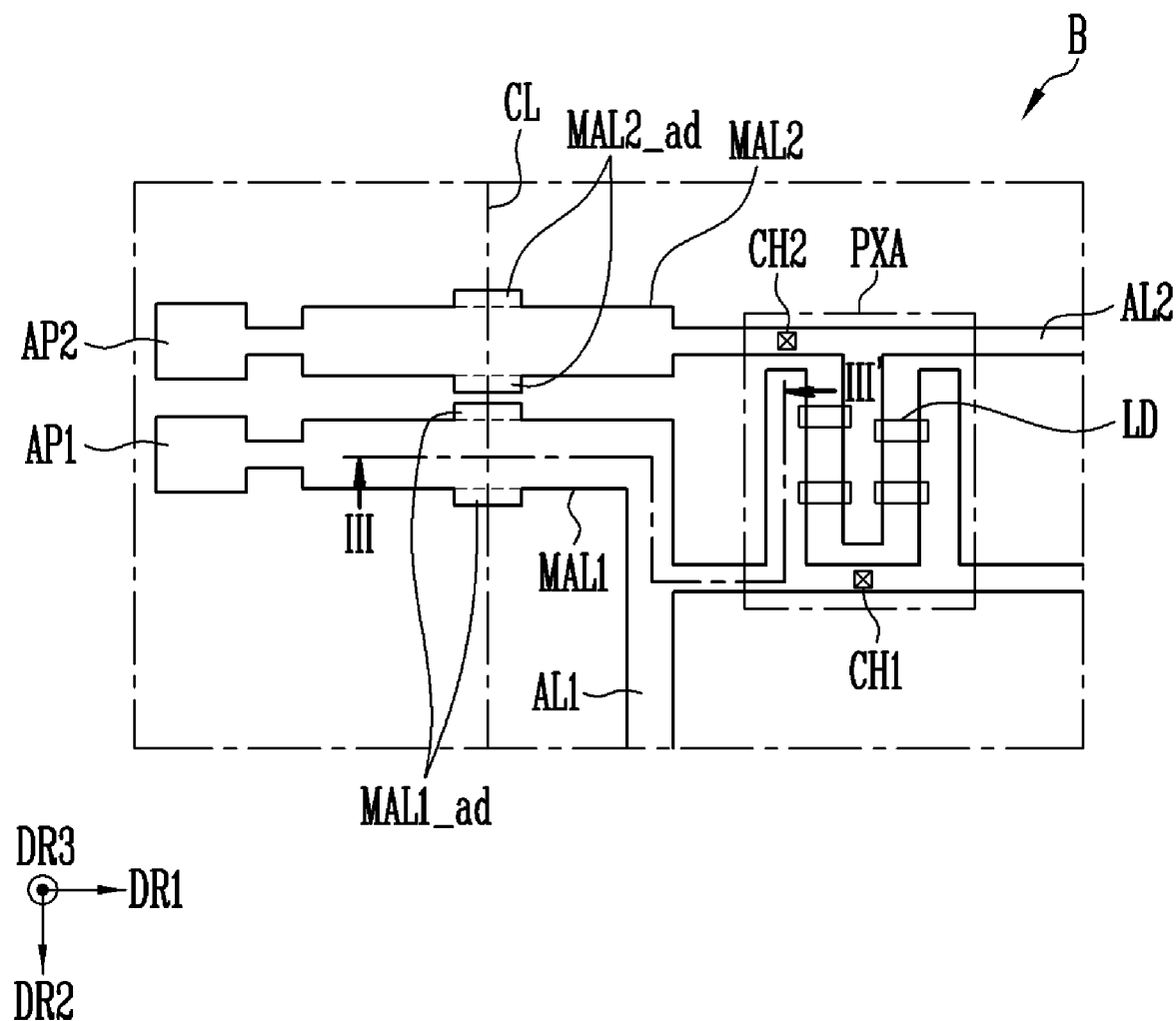
FIG. 11 is a plan view illustrating an example of the subpixel in which the third region B of FIG. 10 is enlarged.
Figure 14:
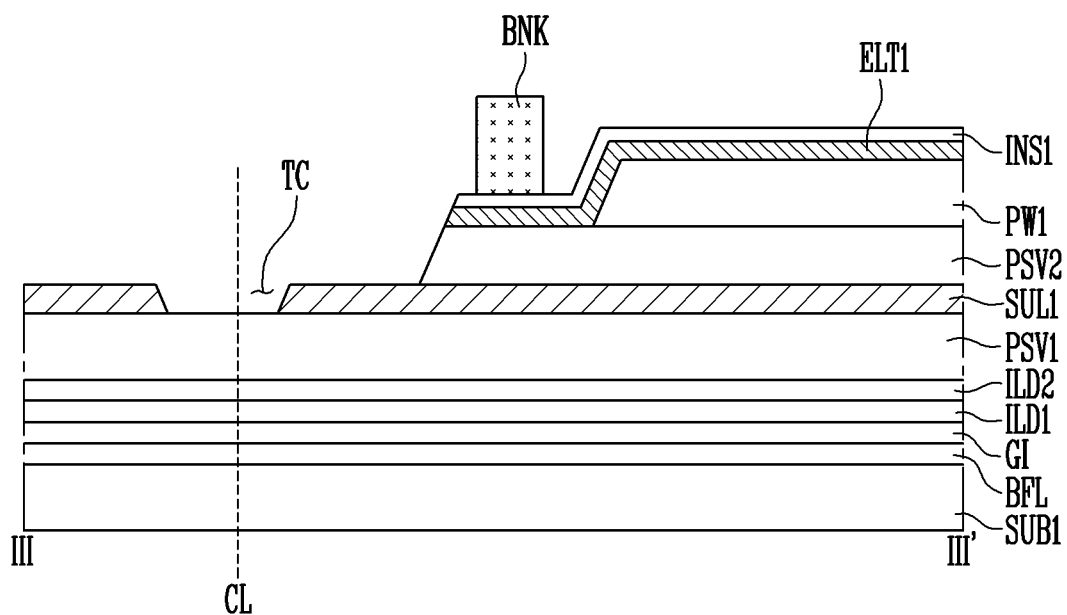
Figure 15:
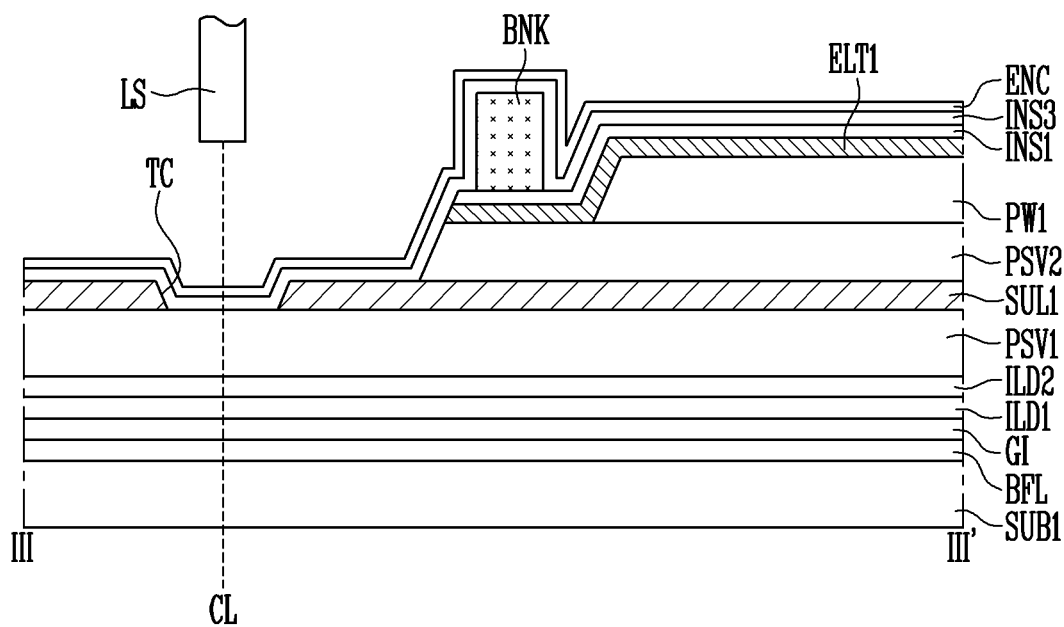
Figure 16:
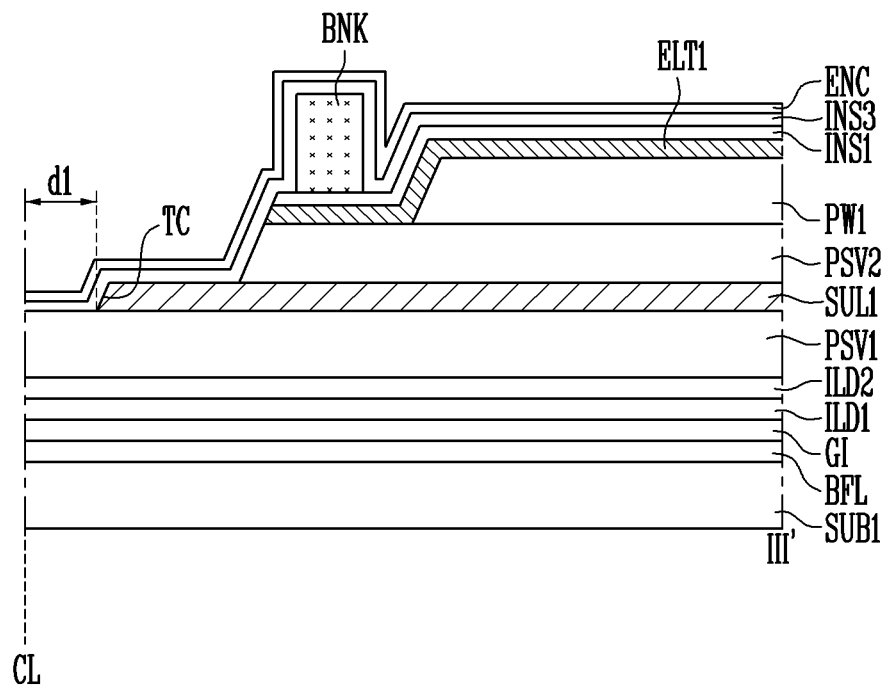

FIG. 9 is a flowchart illustrating a method of manufacturing a display device according to some embodiments of the disclosure. FIG. 10 is a diagram for describing the alignment line formed on the mother substrate. FIG. 11 is a plan view illustrating an example of the subpixel in which the third region B of FIG. 10 is enlarged. FIGS. 12 to 16 are cross-sectional views taken along the line III-III' of FIG. 11, and are views for describing the method of manufacturing the display device of FIG. 9.

Hereinafter, a method of manufacturing a light-emitting display device according to some embodiments of the disclosure will be described with reference to FIGS. 9 and 10 to 16.

In the method of manufacturing the display device, the mother substrate 100 (or the substrate SUB1) may be prepared (S100).

Display panels may be individually separated through a cutting process after forming (e.g., simultaneously or substantially simultaneously forming) a plurality of display panels on one mother substrate 100 is shown. Here, the display panels may be one of the display panels described with reference to FIGS. 4 and 6 to 8B.

The mother substrate 100 may comprise the cell regions CEL1 and CEL2 for forming the plurality of display panels. The cell regions CEL1 and CEL2 of the mother substrate 100 may comprise the display area DA including the plurality of pixel areas PXA, and the non-display area NDA located outside the display area DA. The cell regions CEL1 and CEL2 may be defined by the cutting line CL.

First and second alignment pads AP1 and AP2 may be comprised in one region (for example, an edge region) of the mother substrate 100.

The first and second sub lines SUL1 and SUL2 of the first and second alignment lines AL1 and AL2 including the pixel circuit layer PCL and the trench region TC may be formed (S200).

When the substrate SUB1 is prepared, the pixel circuit layer PCL may be formed on the substrate SUB1, and the sub lines SUL1 and SUL2 of each of the first and second alignment lines AL1 and AL2, may be formed on the substrate SUB1. Each of the sub lines SUL1 and SUL2 may be formed at the same layer in the same operation as at least one electrode formed on the pixel circuit layer PCL. For example, the first and second sub lines SUL1 and SUL2 may be formed on the first passivation film PSV1. Each of the first and second sub lines SUL1 and SUL2 may be configured of a single layer or multiple layers.

The first and second sub lines SUL1 and SUL2 may comprise the trench region TC. The trench region TC is a discontinuous section of the first and second sub lines SUL1 and SUL2, and may be formed through a photolithography process. As shown in FIG. 12, the trench region TC may be formed in a region near the cutting line CL. Because the cutting line CL corresponds to an outer periphery of each of the cells CEL1 and CEL2, when the trench region TC is not present in the first and second sub lines SUL1 and SUL2, cross sections of the first and second sub lines SUL1 and SUL2 may be exposed along the cutting line CL.

The trench region TC may provide a space in which cross sections of the first and second sub lines SUL1 and SUL2 may be covered by the insulating layer INS3 and/or the encapsulation film ENC during a subsequent display device manufacturing process. Therefore, static electricity may be reduced or prevented from flowing into the cells CEL1 and CEL2 from the outside.

The trench region TC may have a rectangular shape on a plane. The sub lines SUL1 and SUL2 separated by the trench region TC may be located to be spaced apart from each other by a distance (e.g., a predetermined distance) d1 in left and right directions with respect to the cutting line CL as a reference line. At this time, the distance d1 is sufficient so that the exposed cross section of the sub lines SUL1 and SUL2 are secured with a space that may be covered by the third insulating layer INS3 and/or the encapsulation film ENC.

Further, main lines MAL1 and MAL2 of each of the first and second alignment lines AL1 and AL2 including the first and second electrodes ELT1 and ELT2 and extension portions MAL1_ad and MAL2_ad may be formed on the substrate SUB1 on which the pixel circuit layer PCL and the sub lines SUL1 and SUL2 of the first and second alignment lines AL1 and AL2 are formed (S300).

The main lines MAL1 and MAL2 of each of the first and second alignment lines AL1 and AL2 may be formed (e.g., may be formed simultaneously or substantially simultaneously) with the first and second electrodes ELT1 and ELT2. The first and second electrodes ELT1 and ELT2 may be formed in the pixel areas PXA of each display area DA.

The main lines MAL1 and MAL2 of the first and second alignment lines AL1 and AL2 may be connected to the first electrode ELT1 and the second electrode ELT2, respectively. In addition, the main lines MAL1 and MAL2 of the first and second alignment lines AL1 and AL2 may be electrically connected to the sub lines SUL1 and SUL2 of each of the first and second alignment lines AL1 and AL2, respectively. As shown in FIG. 10, the first main line MAL1 may be electrically connected to the first sub line SUL1 through the third contact hole CH3. The second main line MAL2 may be electrically connected to the second sub line SUL2 through the fourth contact hole CH4. Although only one third contact hole CH3 and only one fourth contact hole CH4 are shown for convenience of description, a plurality of third and fourth contact holes CH3 and CH4 may be formed for satisfactory transmission of the alignment signal.

The first and second main lines MAL1 and MAL2 may comprise the extension portions MAL1_ad and MAL2_ad, respectively. The extension portions MAL1_ad and MAL2_ad may be partial sections in which the first and second main lines MAL1 and MAL2 are wider/extend in a width direction (for example, the second direction DR2), and may be formed through a photolithography process. As shown in FIG. 11, the extension portions MAL1_ad and MAL2_ad may be formed in a region near the cutting line CL. The extension portions MAL1_ad and MAL2_ad may be formed in some sections of the first and second main line MAL1 and MAL2 overlapping the trench region TC in a thickness direction (for example, the third direction DR3). In order to self-align the light-emitting elements LD, an alignment voltage (e.g., a predetermined alignment voltage) is applied through the first and second alignment lines AL1 and AL2. Because the trench region TC is a region in which the sub lines SUL1 and SUL2 are not present, a resistance may be larger than that of other sections formed of multiple layers including the main lines MAL1 and MAL2 and the sub lines SUL1 and SUL2.

While the alignment voltage is applied through the first and second alignment lines AL1 and AL2, a resistance increase due to the trench region TC may be reduced or prevented by increasing the areas of the main lines MAL1 and MAL2 through the extension portions MAL1_ad and MAL2_ad.

Length of the extension portions MAL1_ad and MAL2_ad in an extension direction (for example, the first direction DR1) may be the same as lengths of the trench region TC in an extension direction (for example, the first direction DR1). For example, the extension portions MAL1_ad and MAL2_ad may be about as wide as the trench region TC. However, the disclosure is not limited thereto, and the length (2*d1) of the extension portions MAL1_ad and MAL2_ad in the extension direction (for example, the first direction DR1) and the lengths (d2) in the width direction (for example, the second direction DR2) may be variously changed to reduce the resistance that is otherwise increased due to the trench region TC.

As described with reference to FIGS. 6 to 8B, the bank BNK may be located on the first insulating layer INS1. For example, the bank BNK may be formed between other subpixels so as to surround the emission area EMA of the subpixel SPX to configure the pixel definition film that divides the emission area EMA of the subpixel SPX. Further, the light-emitting element LD may be supplied and aligned (S400).

The light-emitting elements LD may be supplied on the substrate SUB1 on which the first and second electrodes ELT1 and ELT2 and the first and second alignment lines AL1 and AL2 are formed. The plurality of light-emitting elements LD may be supplied to each pixel area PXA of the display area DA using one or more of various methods, such as an inkjet method. In addition, at the same time as or after the supply of the light-emitting elements LD, power may be applied to the first and second alignment lines AL1 and AL2 through the first and second alignment pads AP1 and AP2 to align the light-emitting elements LD between the first and second pixel electrodes ELT1 and ELT2, which are connected to the first and second alignment lines AL1 and AL2.

As described with reference to FIGS. 6 to 8B, after the self-alignment of the light-emitting elements LD is completed, the main lines MAL1 and MAL2 may be removed from the non-display area NDA. At this time, the first insulating layer INS located on the main lines MAL1 and MAL2 may also be removed.

Further, the first and second contact electrodes CNE1 and CNE2, the third insulating layer INS3, and the encapsulation film ENC may be formed (S500).

The first and second contact electrodes CNE1 and CNE2 may be formed on the substrate SUB1 on which the light-emitting elements LD are aligned. Each of the first contact electrodes CNE1 may connect the first end portion EP1 of at least one of the light-emitting elements LD to the first electrode ELT1 located in the corresponding pixel area PXA. In addition, each of the second contact electrodes CNE2 may connect the second end portion EP2 of at least one of the light-emitting elements LD to the second electrode ELT2 located in the corresponding pixel area PXA.

As shown in FIGS. 8A and 8B, the third insulating layer INS3 may be interposed between the first contact electrode CNE1 and the second contact electrode CNE2. The third insulating layer INS3 and the encapsulation film ENC may be sequentially stacked on the sub lines SUL1 and SUL2 located in the non-display area NDA. At this time, the cross section of the sub lines SUL1 and SUL2 exposed by the trench region TC may be covered by the third insulating layer INS3 and the encapsulation film ENC.

Further, the light-emitting display panels (or the cells CEL1 and CEL2) that are formed together on the mother substrate 100 may be individually separated by performing a cutting process along the cutting line CL (S600). According to an example, the cutting process may be a laser (LS) process. Thereafter, a module process or the like for each display panel PNL may be performed.

Although the technical spirit of the disclosure has been described in detail in accordance with the above-described embodiments, it should be noted that the above-described embodiments are for the purpose of description and not of limitation. In addition, those skilled in the art may understand that various modifications are possible within the scope of the technical spirit of the disclosure.

The scope of the disclosure is not limited to the details described in the detailed description of the specification, but should be defined by the claims. In addition, it is to be construed that all changes or modifications derived from the meaning and scope of the claims and equivalent concepts thereof are comprised in the scope of the disclosure.

What is claimed is:

1. A display device comprising:
   a substrate comprising a display area comprising a plurality of pixel areas, and a non-display area located outside the display area;
   a pixel circuit layer comprising a plurality of circuit elements in the display area;
   a display element layer comprising a plurality of light-emitting elements in the display area on the pixel circuit layer; and
   a first alignment line and a second alignment line on the substrate, and each comprising a main line at the same layer as at least one electrode on the display element layer, and a sub line electrically connected to the main line and at the same layer as at least one electrode on the pixel circuit layer,
   wherein the first alignment line and the second alignment line do not comprise the main line in the non-display area, and comprise the sub line to be spaced apart from one edge of the substrate.

2. The display device according to claim 1, wherein the display element layer comprises:
   a first electrode and a second electrode in each pixel area on the pixel circuit layer;
   a first insulating layer on one region of the first electrode and the second electrode; and
   the light-emitting elements between the first and second electrodes of each pixel area.

3. The display device according to claim 2, wherein the first and second electrodes are spaced apart from each other at the same layer in each pixel area,
   wherein a first end portion of the light-emitting elements is electrically connected to a first electrode of a corresponding pixel, and
   wherein a second end portion of the light-emitting elements is electrically connected to a second electrode of the corresponding pixel.

4. The display device according to claim 3, further comprising a second insulating layer partially only on one region of the light-emitting elements without covering the first end portion and the second end portion of the light-emitting elements.

5. The display device according to claim 4, further comprising:
   a first contact electrode connecting the first end portion and the first electrode to each other; and
   a second contact electrode connecting the second end portion and the second electrode to each other, wherein a third insulating layer is interposed between the first contact electrode and the second contact electrode.

6. The display device according to claim 5, wherein an upper surface and one end portion of the sub line are covered by the third insulating layer.

7. The display device according to claim 6, further comprising an encapsulation film on the third insulating layer.

8. The display device according to claim 2, wherein the main line of each of the first and second alignment lines is at the same layer as at least one of the first and second electrodes.

9. The display device according to claim 1, wherein each of the light-emitting elements comprises:
- a first conductive semiconductor layer doped with a first conductive dopant;
- a second conductive semiconductor layer doped with a second conductive dopant; and
- an active layer provided between the first conductive semiconductor layer and the second conductive semiconductor layer.

10. The display device according to claim 9, wherein each of the light-emitting elements comprises a rod-shaped light-emitting diode having a micro scale or nano scale size.

* * * * *